(12) United States Patent
Koezuka et al.

(10) Patent No.: US 10,431,600 B2
(45) Date of Patent: Oct. 1, 2019

(54) METHOD FOR MANUFACTURING A SEMICONDUCTOR DEVICE INCLUDING A METAL OXIDE FILM

(71) Applicant: Semiconductor Energy Laboratory Co., Ltd., Atsugi-shi, Kanagawa-ken (JP)

(72) Inventors: Junichi Koezuka, Tochigi (JP); Kenichi Okazaki, Tochigi (JP); Daisuke Kurosaki, Tochigi (JP); Masami Jintyou, Shimotsuga (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 4 days.

(21) Appl. No.: 15/819,201

(22) Filed: Nov. 21, 2017

(65) Prior Publication Data
US 2018/0083048 A1 Mar. 22, 2018

Related U.S. Application Data

(63) Continuation of application No. 15/010,392, filed on Jan. 29, 2016, now Pat. No. 9,831,275.

(30) Foreign Application Priority Data

Feb. 4, 2015 (JP) ................................ 2015-019938

(51) Int. Cl.
*H01L 27/12* (2006.01)
*H01L 29/786* (2006.01)
*H01L 29/66* (2006.01)

(52) U.S. Cl.
CPC ........ *H01L 27/1225* (2013.01); *H01L 27/127* (2013.01); *H01L 27/1248* (2013.01);
(Continued)

(58) Field of Classification Search
None
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 103098220 A 5/2013
EP 1737044 A 12/2006
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Cory W Eskridge
(74) *Attorney, Agent, or Firm* — Robinson Intellectual Property Law Office; Eric J. Robinson

(57) ABSTRACT

A method for manufacturing a highly reliable semiconductor device is provided. The method includes the steps of: forming an oxide semiconductor film at a first temperature; processing the oxide semiconductor film into an island shape; not performing a process at a temperature higher than the first temperature, but depositing a material to be source and drain electrodes by a sputtering method; processing the material to form the source and drain electrodes; forming a protective insulating film, and then forming a first barrier film; adding excess oxygen or oxygen radicals to the protective insulating film through the first barrier film; performing heat treatment at a second temperature lower than 400° C. to diffuse the excess oxygen or oxygen radicals into the oxide semiconductor film; and removing part of the first barrier film and part of the protective insulating film by wet etching, and then forming a second barrier film.

20 Claims, 25 Drawing Sheets

(52) U.S. Cl.
CPC .... *H01L 29/66969* (2013.01); *H01L 29/7869* (2013.01); *H01L 29/78606* (2013.01); *H01L 29/78648* (2013.01); *H01L 29/78696* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,236,627 B2 | 8/2012 | Tsubuku et al. |
| 8,470,649 B2 | 6/2013 | Yamazaki et al. |
| 8,551,810 B2 | 10/2013 | Yamazaki |
| 8,551,824 B2 | 10/2013 | Yamazaki et al. |
| 8,828,794 B2 | 9/2014 | Yamazaki et al. |
| 8,901,554 B2 | 12/2014 | Sasagawa et al. |
| 8,916,424 B2 | 12/2014 | Isobe et al. |
| 8,945,982 B2 | 2/2015 | Yamazaki |
| 8,999,773 B2 | 4/2015 | Hanaoka et al. |
| 9,117,662 B2 | 8/2015 | Isobe et al. |
| 9,153,436 B2 | 10/2015 | Yamazaki et al. |
| 9,171,957 B2 | 10/2015 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0062435 A1* | 3/2011 | Yamazaki ........... H01L 29/7869 257/43 |
| 2011/0212569 A1 | 9/2011 | Yamazaki et al. |
| 2011/0263091 A1 | 10/2011 | Yamazaki |
| 2013/0161610 A1* | 6/2013 | Yamazaki ........... H01L 29/7869 257/43 |
| 2013/0181218 A1 | 7/2013 | Maeda et al. |
| 2013/0193432 A1 | 8/2013 | Yamazaki |
| 2013/0203214 A1 | 8/2013 | Isobe et al. |
| 2013/0207111 A1 | 8/2013 | Yamazaki |
| 2013/0267068 A1 | 10/2013 | Hanaoka et al. |
| 2014/0106504 A1 | 4/2014 | Yamazaki et al. |
| 2014/0206133 A1 | 7/2014 | Koezuka et al. |
| 2015/0372022 A1 | 12/2015 | Okazaki et al. |
| 2016/0020329 A1 | 1/2016 | Koezuka et al. |
| 2016/0118502 A1 | 4/2016 | Yamazaki et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-094853 A | 5/2012 |
| JP | 2013-175715 A | 9/2013 |

(56) References Cited

FOREIGN PATENT DOCUMENTS

| | | |
|---|---|---|
| JP | 2013-179290 A | 9/2013 |
| JP | 2016-021563 A | 2/2016 |
| KR | 2013-0064116 A | 6/2013 |
| KR | 2013-0092463 A | 8/2013 |
| TW | 201232739 | 8/2012 |
| TW | 201338174 | 9/2013 |
| WO | WO-2004/114391 | 12/2004 |
| WO | WO-2012/043806 | 4/2012 |
| WO | WO-2015/193766 | 12/2015 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Techcnical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMo3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW'08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW'09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.

Tsuda.K et al., "Ultra Low Power Consumption Technologies for Mobile TFT-LCDs", IDW'02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/IB2016/050417) dated May 17, 2016.

Written Opinion (Application No. PCT/IB2016/050417) dated May 17, 2016.

\* cited by examiner

FIG. 11A
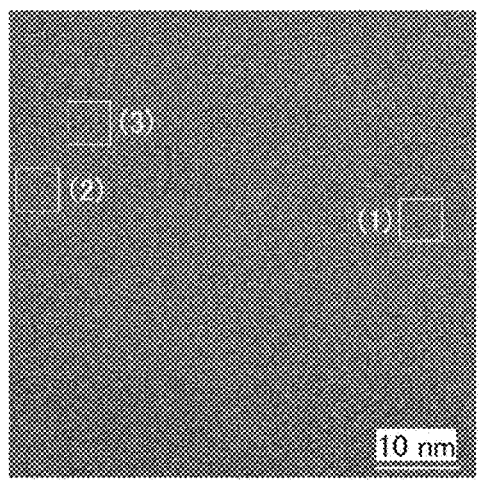
FIG. 11B    FIG. 11C    FIG. 11D
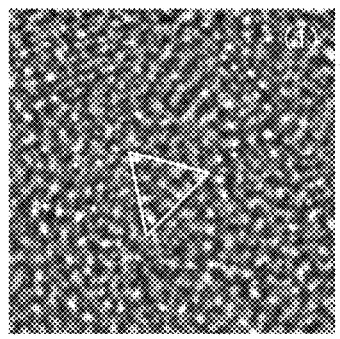 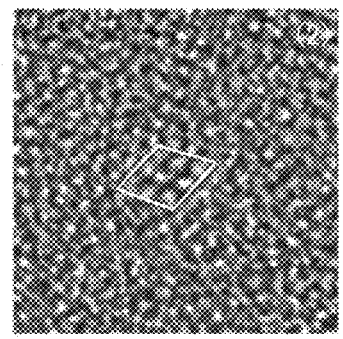 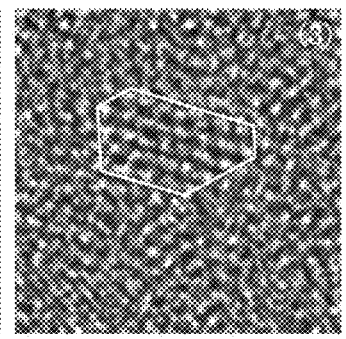

FIG. 13A
FIG. 13B
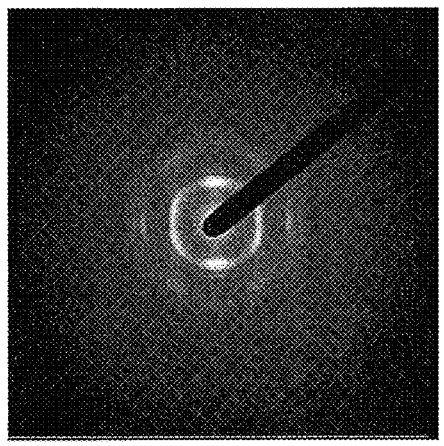
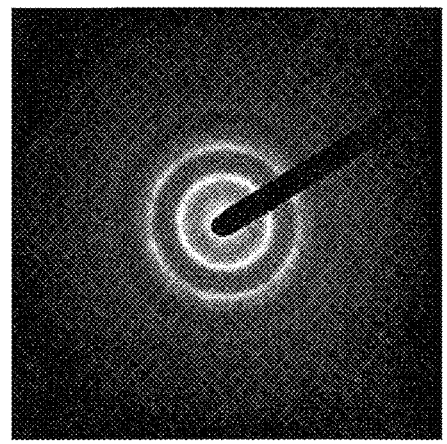

a side view of pellet a top view of pellet

METHOD FOR MANUFACTURING A SEMICONDUCTOR DEVICE INCLUDING A METAL OXIDE FILM

TECHNICAL FIELD

One embodiment of the present invention relates to a semiconductor device including an oxide semiconductor film and a display device including the semiconductor device. Another embodiment of the present invention relates to a method for manufacturing a semiconductor device including an oxide semiconductor film.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may include a semiconductor device.

BACKGROUND ART

Attention has been focused on a technique for forming a transistor using a semiconductor thin film formed over a substrate having an insulating surface (also referred to as a field-effect transistor (FET) or a thin film transistor (TFT)). Such transistors are applied to a wide range of electronic devices such as an integrated circuit (IC) and an image display device (display device). A semiconductor material typified by silicon is widely known as a material for a semiconductor thin film that can be used in a transistor. As another material, an oxide semiconductor has been attracting attention.

A highly reliable semiconductor device in which a transistor using an oxide semiconductor has stable electrical characteristics is disclosed (for example, see Patent Document 1). In the semiconductor device, oxide semiconductor films with different compositions are stacked such that an oxide semiconductor film containing a large amount of In is positioned on the channel side and an oxide semiconductor film containing a large number of stabilizers such as Ga is positioned on the back channel side.

REFERENCE

Patent Document

[Patent Document 1] Japanese Published Patent Application No. 2013-175715

DISCLOSURE OF INVENTION

An oxide semiconductor film containing a large amount of In might have a small energy band gap ($E_g$) (for example, smaller than 3.0 eV). Such an oxide semiconductor film having a small $E_g$ is more largely affected by light than an oxide semiconductor film having a large $E_g$ (for example, larger than or equal to 3.0 eV and smaller than or equal to 3.5 eV). For example, when a transistor including an oxide semiconductor film having a small $E_g$ is subjected to a bias-temperature stress test with application of a negative bias and light irradiation (negative gate bias-temperature (GBT) stress test with light irradiation), the reliability of the transistor is reduced in some cases.

The negative GBT stress test with light irradiation is one kind of accelerated test and can evaluate, in a short time, change in characteristics of transistors subjected to light irradiation, which is caused by long-term use. In particular, the amount of change in the threshold voltage ($\Delta V_{th}$) of the transistor between before and after a negative GBT stress test with light irradiation is an important indicator for examining the reliability of the transistor. The smaller the amount of change in the threshold voltage ($\Delta V_{th}$) of the transistor between before and after the negative GBT stress test with light irradiation is, the higher the reliability of the transistor is.

In the case where a glass substrate is used for manufacturing a semiconductor device including an oxide semiconductor film, the glass substrate might be distorted when the process temperature is high. A glass substrate is noticeably distorted particularly when having any of the following large sizes: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Therefore, the temperature in the process of manufacturing the semiconductor device should be low.

In view of the above, an object of one embodiment of the present invention is to inhibit a change in the electrical characteristics and improve the reliability of a transistor including an oxide semiconductor film containing a large amount of In. Another object of one embodiment of the present invention is to provide a semiconductor device with low power consumption. Another object of one embodiment of the present invention is to provide a novel semiconductor device. Another object of one embodiment of the present invention is to provide a method for manufacturing a novel semiconductor device. Another object of one embodiment of the present invention is to provide a method for manufacturing a highly reliable semiconductor device at relatively low temperature. Another object of one embodiment of the present invention is to provide a method for manufacturing a novel display device.

Note that the descriptions of the above objects do not disturb the existence of other objects. In one embodiment of the present invention, there is no need to achieve all the objects. Objects other than the above objects will be apparent from and can be derived from the description of the specification and the like.

One embodiment of the present invention is a method for manufacturing a semiconductor device, including the steps of: forming an oxide semiconductor film at a first temperature; then, processing the oxide semiconductor film into an island shape; then, not performing a process at a temperature higher than the first temperature, but depositing a material to be a source electrode and a drain electrode by a sputtering method; processing the material to form the source electrode and the drain electrode; then, forming a first protective insulating film and/or a second protective insulating film, and then forming a first barrier film; adding excess oxygen or an oxygen radical to the second protective insulating film through the first barrier film; performing heat treatment at a second temperature lower than 400° C. to diffuse the excess oxygen or the oxygen radical into the oxide semiconductor film; and removing the first barrier film or a part of the first barrier film, and a part of the second protective insulating film by wet etching, and then forming a second barrier film.

In the above embodiment, the first barrier film is preferably an indium tin oxide film, an indium tin silicon oxide film, or an indium oxide film.

In the above embodiment, the second barrier film is preferably a silicon nitride oxide film or a silicon nitride film.

Another embodiment of the present invention is a method for manufacturing a semiconductor device, including the steps of: forming an oxide semiconductor film at a first temperature; then, processing the oxide semiconductor film into an island shape; then, not performing a process at a temperature higher than the first temperature, but depositing a material to be a source electrode and a drain electrode by a sputtering method; processing the material to form the source electrode and the drain electrode; then, forming a first protective insulating film and/or a second protective insulating film, and then forming a metal oxide film as a first barrier film by a sputtering method to add excess oxygen or an oxygen radial to the second protective insulating film; and performing heat treatment at a second temperature lower than 400° C. to diffuse the excess oxygen or the oxygen radical into the oxide semiconductor film.

In the above embodiment, the metal oxide film is preferably an aluminum oxide film, a hafnium oxide film, or an yttrium oxide film.

In the above embodiment, the oxide semiconductor film preferably has a layered structure of a first oxide semiconductor film having an atomic ratio of In:M (aluminum, gallium, yttrium, or tin):Zn=4:$\alpha$1 (1.5≤$\alpha$1≤2.5):$\alpha$2 (2.5≤$\alpha$2≤3.5) and a second oxide semiconductor film having an atomic ratio of In:M:Zn=1:$\beta$1 (0.8≤$\beta$1≤1.2):$\beta$2 (0.8≤$\beta$2≤1.2).

In the above embodiment, the oxide semiconductor film preferably includes a CAAC-OS.

In the above embodiment, the second temperature is preferably lower than 375° C. In the above embodiment, the second temperature is preferably higher than or equal to 340° C. and lower than or equal to 360° C.

Another embodiment of the present invention is a method for manufacturing a semiconductor device, including the steps of: forming an oxide semiconductor film at a first temperature; processing the oxide semiconductor film into an island shape; depositing a material to be a source electrode and a drain electrode over the oxide semiconductor film by a sputtering method; processing the material to form the source electrode and the drain electrode; forming a first protective insulating film and a second protective insulating film over the oxide semiconductor film, the source electrode, and the drain electrode; heating the first protective insulating film and the second protective insulating film at a second temperature higher than the first temperature; forming a first barrier film over the second protective insulating film; adding excess oxygen or an oxygen radical to the second protective insulating film through the first barrier film; removing a part of the first barrier film and a part of the second protective insulating film by wet etching; and forming a second barrier film over the second protective insulating film at a third temperature higher than the first temperature. One of or both the second temperature and the third temperature is/are the highest in a process of the steps.

In the above embodiment, the oxide semiconductor film preferably has a layered structure of a first oxide semiconductor film having an atomic ratio of In:M (aluminum, gallium, yttrium, or tin): Zn=4:$\alpha$1 (1.5≤$\alpha$1≤2.5):$\alpha$2 (2.5≤$\alpha$2≤3.5) and a second oxide semiconductor film having an atomic ratio of In:M:Zn=1:$\beta$1 (0.8≤$\beta$1≤1.2):$\beta$2 (0.8≤$\beta$2≤1.2).

In the above embodiment, the oxide semiconductor film preferably includes a crystal part, and the crystal part preferably has c-axis alignment.

In the above embodiment, the first temperature is preferably lower than 340° C. In the above embodiment, the first temperature is preferably higher than or equal to 100° C. and lower than or equal to 200° C.

In the above embodiment, the second temperature is preferably lower than 375° C. In the above embodiment, the second temperature is preferably higher than or equal to 340° C. and lower than or equal to 360° C.

Another embodiment of the present invention is a method for manufacturing a semiconductor device, including the steps of: forming an oxide semiconductor film at a first temperature; processing the oxide semiconductor film into an island shape; depositing a material to be a source electrode and a drain electrode over the oxide semiconductor film by a sputtering method; processing the material to form the source electrode and the drain electrode; forming a first protective insulating film and a second protective insulating film over the oxide semiconductor film, the source electrode, and the drain electrode; heating the first protective insulating film and the second protective insulating film at a second temperature higher than the first temperature; forming a metal oxide film over the second protective insulating film to add excess oxygen or an oxygen radical to the second protective insulating film; and heating the second protective insulating film at a third temperature higher than the first temperature to diffuse the excess oxygen or the oxygen radical into the oxide semiconductor film. One of or both the second temperature and the third temperature is/are the highest in a process of the steps.

Another embodiment of the present invention is a method for manufacturing a semiconductor device, including the steps of: forming an oxide semiconductor film at a first temperature; processing the oxide semiconductor film into an island shape; depositing a material to be a source electrode and a drain electrode over the oxide semiconductor film by a sputtering method; processing the material to form the source electrode and the drain electrode; forming a first protective insulating film and a second protective insulating film over the oxide semiconductor film, the source electrode, and the drain electrode; heating the first protective insulating film and the second protective insulating film at a second temperature higher than the first temperature; and at a third temperature higher than the first temperature, forming a metal oxide film over the second protective insulating film to add excess oxygen or an oxygen radical to the second protective insulating film and diffuse oxygen, the excess oxygen, or the oxygen radical in the second protective insulating film into the oxide semiconductor film. One of or both the second temperature and the third temperature is/are the highest in a process of the steps.

In the above embodiment, the metal oxide film is preferably an aluminum oxide film, a hafnium oxide film, or an yttrium oxide film.

In the above embodiment, the oxide semiconductor film preferably has a layered structure of a first oxide semiconductor film having an atomic ratio of In:M (aluminum, gallium, yttrium, or tin):Zn=4:$\alpha$1 (1.5≤$\alpha$1≤2.5):$\alpha$2

$(2.5 \leq \alpha 2 \leq 3.5)$ and a second oxide semiconductor film having an atomic ratio of In:M:Zn=1:$\beta 1$ $(0.8 \leq \beta 1 \leq 1.2)$:$\beta 2$ $(0.8 \leq \beta 2 \leq 1.2)$.

In the above embodiment, the oxide semiconductor film preferably includes a crystal part, and the crystal part preferably has c-axis alignment.

In the above embodiment, the first temperature is preferably lower than 340° C. In the above embodiment, the first temperature is preferably higher than or equal to 100° C. and lower than or equal to 200° C.

In the above embodiment, one of or both the second temperature and the third temperature is/are preferably lower than 375° C. In the above embodiment, one of or both the second temperature and the third temperature is/are preferably higher than or equal to 340° C. and lower than or equal to 360° C.

According to one embodiment of the present invention, a change in electrical characteristics can be inhibited and reliability can be improved in a semiconductor device using a transistor including an oxide semiconductor. According to one embodiment of the present invention, a semiconductor device with low power consumption can be provided. According to one embodiment of the present invention, a novel semiconductor device can be provided. According to one embodiment of the present invention, a method for manufacturing a novel semiconductor device can be provided. According to one embodiment of the present invention, a method for manufacturing a highly reliable semiconductor device at relatively low temperature can be provided. According to one embodiment of the present invention, a novel display device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 11A to 11D are Cs-corrected high-resolution TEM images of a plane of a CAAC-OS.

FIGS. 13A and 13B show electron diffraction patterns of a CAAC-OS.

BEST MODE FOR CARRYING OUT THE INVENTION

Figure 1A:
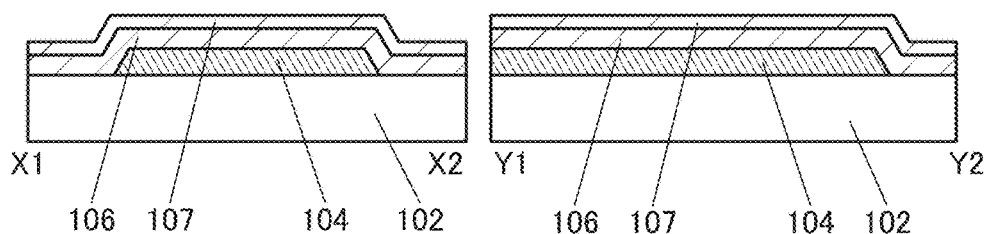
FIGS. 1A to 1C are cross-sectional views illustrating an example of a manufacturing process of a semiconductor device.
Figure 1B:
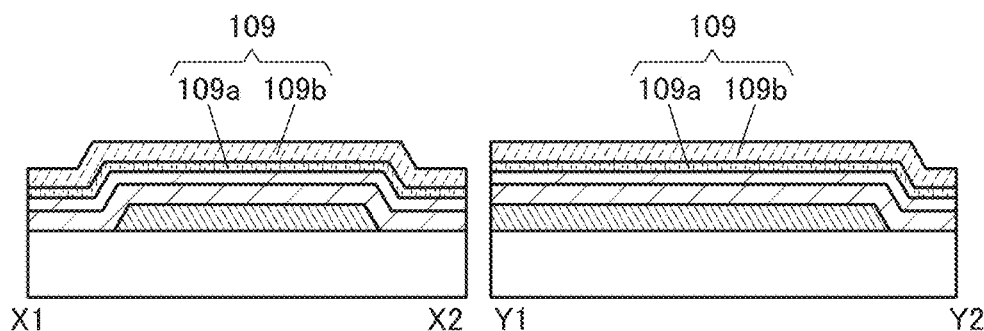
Figure 1C:
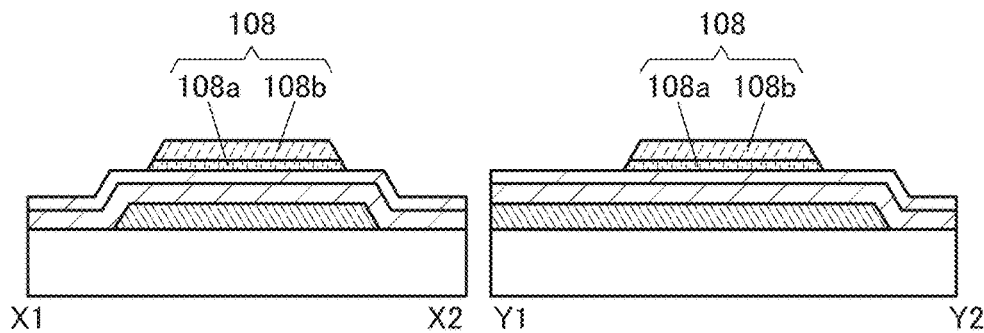

Embodiments will be described below with reference to drawings. The embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over", "above", "under", and "below", are used for convenience in describing a positional relation between components with reference to drawings. Further, the positional relation between components is changed as appropriate in accordance with a direction in which each component is described. Thus, the positional relation is not limited to that described with a term used in this specification and can be explained with another term as appropriate depending on the situation.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Note that in this specification and the like, a "silicon oxynitride film" refers to a film that includes oxygen at a higher proportion than nitrogen, and a "silicon nitride oxide film" refers to a film that includes nitrogen at a higher proportion than oxygen.

In describing structures of the invention with reference to the drawings in this specification and the like, common reference numerals are used for the same portions in different drawings.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. Furthermore, the term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification and the like, the terms "film" and "layer" can be interchanged with each other depending on the case. For example, the term "conductive layer" can be changed into the term "conductive film" in some cases. Also, the term "insulating film" can be changed into the term "insulating layer" in some cases.

(Embodiment 1)

In this embodiment, a semiconductor device that is one embodiment of the present invention and a method for manufacturing the semiconductor device will be described with reference to FIGS. 1A to 1C, FIGS. 2A to 2C, FIGS. 3A to 3C, FIGS. 4A to 4C, FIGS. 5A to 5C, FIGS. 6A and 6B, FIGS. 7A to 7C, FIG. 8, and FIGS. 9A and 9B.

<Structure Example 1 of Semiconductor Device>

Figure 4A:
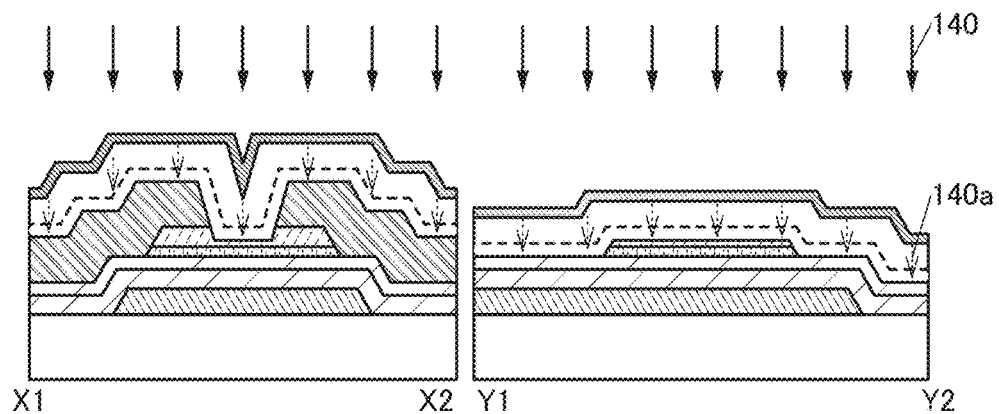
FIGS. 4A to 4C are cross-sectional views illustrating an example of a manufacturing process of a semiconductor device.
Figure 4B:
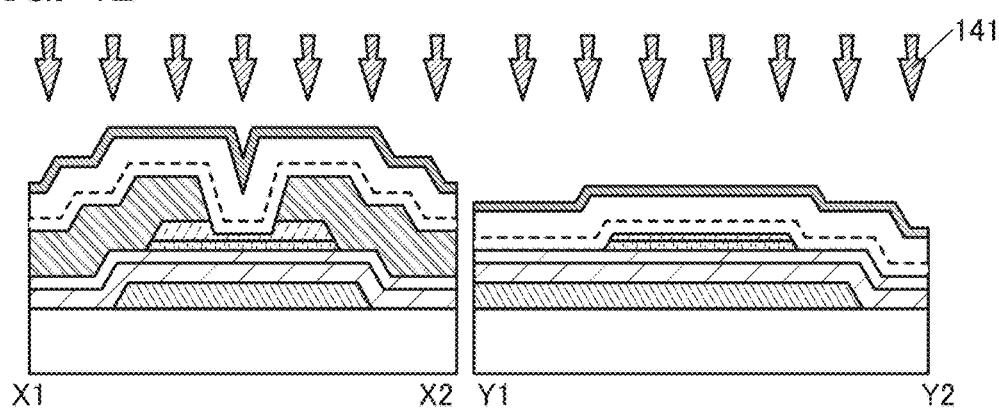
Figure 4C:
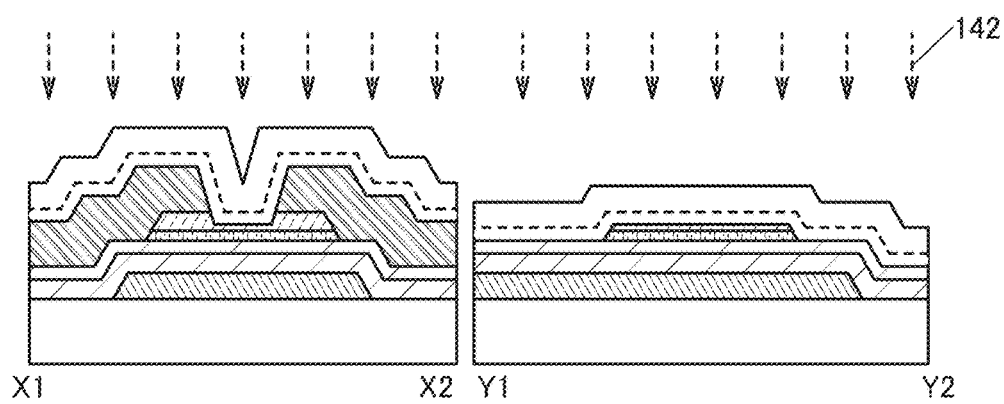
Figure 5A:
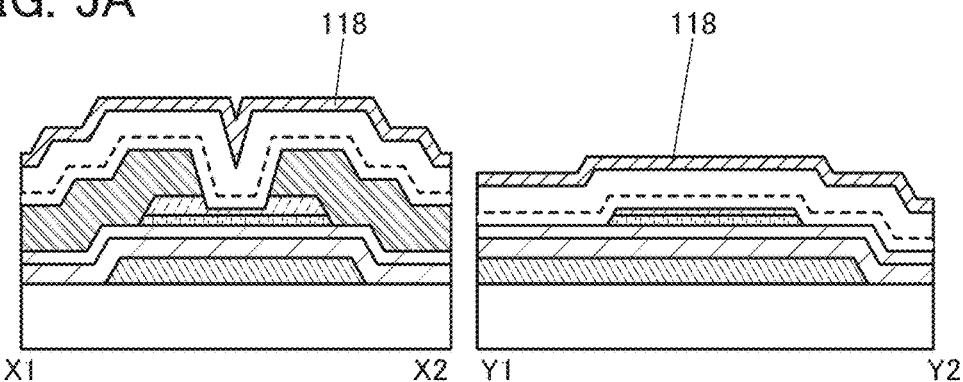
FIGS. 5A to 5C are cross-sectional views illustrating an example of a manufacturing process of a semiconductor device, and cross-sectional views and a top view of one embodiment of a semiconductor device.
Figure 5B:
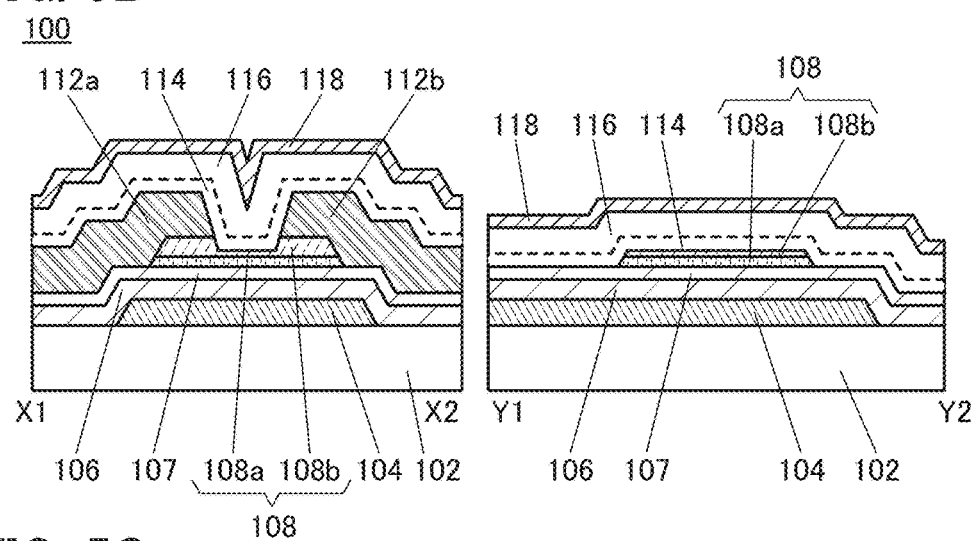
Figure 5C:
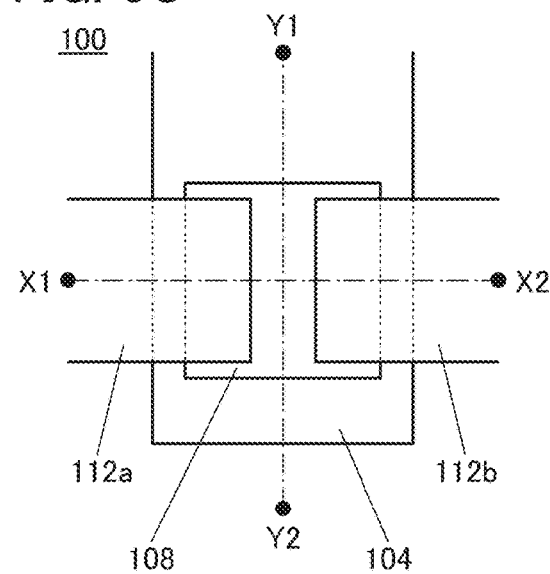

FIG. 5C is a top view of a transistor 100 that is a semiconductor device of one embodiment of the present invention. FIG. 5B is a cross-sectional view taken along the dashed-dotted line X1-X2 in FIG. 5C, and a cross-sectional view taken along the dashed-dotted line Y1-Y2 in FIG. 5C. Note that FIGS. 1A to 1C, FIGS. 2A to 2C, FIGS. 3A to 3C, FIGS. 4A to 4C, and FIG. 5A are cross-sectional views illustrating a manufacturing process of the transistor 100 in FIG. 5B. In each of FIGS. 1A to 1C, FIGS. 2A to 2C, FIGS. 3A to 3C, FIGS. 4A to 4C, and FIGS. 5A and 5B, a cross-sectional view taken along the dashed-dotted line X1-X2 and a cross-sectional view taken along the dashed-dotted line Y1-Y2 are illustrated on the left side and the right side, respectively.

Note that in FIG. 5C, some components of the transistor 100 (e.g., an insulating film functioning as a gate insulating film) are not illustrated to avoid complexity. The direction of the dashed-dotted line X1-X2 may be called a channel length direction, and the direction of the dashed-dotted line Y1-Y2 may be called a channel width direction. As in FIG. 5C, some components are not illustrated in some cases in top views of transistors described below.

The transistor 100 includes a conductive film 104 functioning as a gate electrode over a substrate 102, an insulating film 106 over the substrate 102 and the conductive film 104, an insulating film 107 over the insulating film 106, an oxide semiconductor film 108 over the insulating film 107, a conductive film 112a functioning as a source electrode electrically connected to the oxide semiconductor film 108, and a conductive film 112b functioning as a drain electrode electrically connected to the oxide semiconductor film 108. Over the transistor 100, specifically, over the conductive films 112a and 112b and the oxide semiconductor film 108, insulating films 114, 116, and 118 are provided. The insulating films 114, 116, and 118 function as protective insulating films for the transistor 100. The insulating film 114, the insulating film 116, and the insulating film 118 are also referred to as a first protective insulating film, a second protective insulating film, and a third protective insulating film, respectively.

The oxide semiconductor film 108 includes a first oxide semiconductor film 108a on the conductive film 104 side and a second oxide semiconductor film 108b over the first oxide semiconductor film 108a. Note that the conductive film 104 functions as a gate electrode. Furthermore, the insulating films 106 and 107 function as gate insulating films of the transistor 100.

For the oxide semiconductor film 108, an In-M (M is aluminum, gallium, yttrium, or tin) oxide or an In-M-Zn oxide can be used. It is particularly preferable to use an In-M-Zn oxide for the oxide semiconductor film 108.

The first oxide semiconductor film 108a preferably has an atomic ratio of In:M:Zn=4:$\alpha$1 (1.5≤$\alpha$1≤2.5):$\alpha$2 (2.5≤$\alpha$2≤3.5). The second oxide semiconductor film 108b preferably has an atomic ratio of In:M:Zn=1:$\beta$1 (0.8≤$\beta$1≤1.2):$\beta$2 (0.8≤$\beta$2≤1.2).

When the first oxide semiconductor film 108a has the above atomic ratio, i.e., a composition in which the atomic proportion of In is higher than that of M, the field-effect mobility (also simply referred to as mobility or μFE) of the transistor 100 can be improved. Specifically, the field-effect mobility of the transistor 100 can be higher than 10 cm$^2$/Vs, preferably higher than 30 cm$^2$/Vs.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

Note that when the first oxide semiconductor film 108a has a composition in which the atomic proportion of In is higher than that of M, the electrical characteristics of the transistor 100 are easily changed by light irradiation. However, in the semiconductor device of one embodiment of the present invention, the second oxide semiconductor film 108b is formed over the first oxide semiconductor film 108a. The atomic proportion of In in the second oxide semiconductor film 108b is lower than that in the first oxide semiconductor film 108a, and thus the second oxide semiconductor film 108b has a larger $E_g$ than the first oxide semiconductor film 108a. For this reason, the oxide semiconductor film 108 which is a layered structure of the first oxide semiconductor film 108a and the second oxide semiconductor film 108b has high resistance to a negative bias stress test with light irradiation.

In light irradiation, the amount of light absorbed by the oxide semiconductor film 108 having the above layered structure can be reduced. As a result, a change in the electrical characteristics of the transistor 100 due to light irradiation can be reduced.

When oxygen vacancy is formed in the oxide semiconductor film 108 included in the transistor 100, electrons serving as carriers are generated; as a result, the transistor 100 tends to be normally on. Note that a normally-on transistor refers to a transistor in which current (e.g., current between a drain and a source ($I_{ds}$)) flows at a gate voltage $V_g$ of 0 V. Therefore, for stable transistor characteristics, it is important to reduce oxygen vacancy in the oxide semiconductor film 108, particularly oxygen vacancy in the first oxide semiconductor film 108a. In the structure of the transistor of one embodiment of the present invention, excess oxygen is introduced into an insulating film over the oxide semiconductor film 108, here, the insulating film 114 and/or the insulating film 116 over the oxide semiconductor film 108, whereby oxygen is moved from the insulating film 114 and/or the insulating film 116 to the oxide semiconductor film 108 to fill oxygen vacancy in the oxide semiconductor film 108, particularly in the first oxide semiconductor film 108a. Alternatively, excess oxygen is introduced into the insulating film 116 in the formation of a first barrier film to be formed over the insulating film 116, and oxygen is moved from the insulating film 116 to the oxide semiconductor film 108 to fill oxygen vacancy in the oxide semiconductor film 108, particularly in the first oxide semiconductor film 108a.

It is preferable that the insulating films 114 and 116 each include a region (oxygen-excess region) including oxygen in excess of that in the stoichiometric composition. In other words, the insulating films 114 and 116 are insulating films capable of releasing oxygen. Note that the oxygen-excess region is formed in the insulating films 114 and 116 in such a manner that oxygen is introduced into the insulating films 114 and 116 after the deposition, for example. As a method for introducing oxygen, an ion implantation method, an ion doping method, a plasma immersion ion implantation method, plasma treatment, or the like may be employed.

In order to fill oxygen vacancy in the first oxide semiconductor film 108a, a channel region in the second oxide semiconductor film 108b and its vicinity preferably have a small thickness. For example, the thickness of the channel region in the second oxide semiconductor film 108b and its vicinity is preferably greater than or equal to 1 nm and less than or equal to 20 nm, more preferably greater than or equal to 3 nm and less than or equal to 10 nm.

Furthermore, in order to fill oxygen vacancy in the first oxide semiconductor film 108a, the second oxide semiconductor film 108b preferably has high oxygen permeability. When the second oxide semiconductor film 108b has high oxygen permeability, excess oxygen in the insulating films 114 and 116 can be favorably diffused into the first oxide semiconductor film 108a.

As described above, in a semiconductor device of one embodiment of the present invention, an oxide semiconductor film has a layered structure and an insulating film in contact with the oxide semiconductor film contains excess oxygen; thus, the reliability of the semiconductor device can be high. Furthermore, in one embodiment of the present invention, the temperature in the manufacturing process of the semiconductor device can be low (typically, lower than 400° C. or lower than 375° C. (preferably, higher than or equal to 340° C. and lower than or equal to 360° C.)). Note that the manufacturing process of the semiconductor device will be described later.

Other components of the semiconductor device of this embodiment will be described below in detail.

<Substrate>

There is no particular limitation on a material and the like of the substrate 102 as long as the material has heat resistance high enough to withstand at least heat treatment performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Still alternatively, any of these substrates provided with a semiconductor element may be used as the substrate 102. In the case where a glass substrate is used as the substrate 102, a glass substrate having any of the following sizes can be used: the 6th generation, the 7th generation, the 8th generation, the 9th generation, and the 10th generation. Thus, a large-sized display device can be manufactured. Such a large-sized substrate is preferably used because manufacturing cost can be reduced.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

<Conductive Films Functioning as Gate Electrode and Source and Drain Electrodes>

The conductive film 104 functioning as the gate electrode, the conductive film 112a functioning as the source electrode, and the conductive film 112b functioning as the drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these metal elements; or the like.

Furthermore, the conductive films 104, 112a, and 112b may have a single-layer structure or a layered structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The conductive films 104, 112a, and 112b can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112a, and 112b. The use of a Cu—X alloy film enables the manufacturing cost to be reduced because wet etching process can be used in the processing.

<Insulating Films Functioning as Gate Insulating Films>

As each of the insulating films 106 and 107 functioning as gate insulating films of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a layered structure of the insulating films 106 and 107, an insulating film of a single layer formed using a material selected from the above or an insulating film of three or more layers may be used.

The insulating film 106 functions as a blocking film which inhibits penetration of oxygen. For example, in the case where excess oxygen is supplied to the insulating film 107, the insulating film 114, the insulating film 116, and/or the oxide semiconductor film 108, the insulating film 106 can inhibit penetration of oxygen.

Note that the insulating film 107 that is in contact with the oxide semiconductor film 108 functioning as a channel region of the transistor 100 is preferably an oxide insulating film and preferably includes a region including oxygen in excess of that in the stoichiometric composition (oxygen-excess region). In other words, the insulating film 107 is an insulating film which is capable of releasing oxygen. In order to provide the oxygen-excess region in the insulating film 107, the insulating film 107 is formed in an oxygen atmosphere, for example. Alternatively, the oxygen-excess region may be formed by introduction of oxygen into the insulating film 107 after the deposition. As a method for introducing oxygen, an ion implantation method, an ion doping method, a plasma immersion ion implantation method, plasma treatment, or the like may be employed.

In the case where hafnium oxide is used for the insulating film 107, the following effect is attained. Hafnium oxide has a higher dielectric constant than silicon oxide and silicon oxynitride. Therefore, the insulating film 107 using hafnium oxide can have a larger thickness than the insulating film 107 using silicon oxide; thus, leakage current due to tunnel current can be low. That is, it is possible to provide a transistor with a low off-state current. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

In this embodiment, a silicon nitride film is formed as the insulating film 106, and a silicon oxide film is formed as the insulating film 107. A silicon nitride film has a higher dielectric constant than a silicon oxide film and needs a larger thickness for capacitance equivalent to that of a silicon oxide film. Thus, when a silicon nitride film is used as the gate insulating film of the transistor 100, the physical thickness of the insulating film can be increased. This makes it possible to reduce a decrease in the withstand voltage of the transistor 100 and furthermore to increase the withstand voltage, thereby reducing electrostatic discharge damage to the transistor 100.

<Oxide Semiconductor Film>

The oxide semiconductor film 108 can be formed using any of the materials described above. In the case where the oxide semiconductor film 108 includes an In-M-Zn oxide, it is preferable that the atomic ratio of metal elements of a sputtering target used for forming the In-M-Zn oxide satisfy In M and Zn M. As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable. In the case where the oxide semiconductor film 108 includes an In-M-Zn oxide, it is preferable to use a target including a polycrystalline In-M-Zn oxide as the sputtering target. With the use of the target including a polycrystalline In-M-Zn oxide, the oxide semiconductor film 108 having crystallinity can be easily formed. Note that the atomic ratio of metal elements of the deposited oxide semiconductor film 108 varies from the above atomic ratio of metal elements of the sputtering target within a range of ±40% as an error. For example, when a sputtering target with an atomic ratio of In:Ga:Zn=4:2:4.1 is used, the atomic ratio of In to Ga and Zn in the oxide semiconductor film 108 may be approximately 4:2:3.

The first oxide semiconductor film 108a can be formed using the sputtering target having an atomic ratio of In:M:Zn=2:1:3, InM:Zn=3:1:2, In:M:Zn=4:2:4.1, or the like. It is preferable that the first oxide semiconductor film 108a have an atomic ratio of In:M:Zn=4:$\alpha$1 (1.5≤$\alpha$1≤2.5):$\alpha$2 (2.5≤$\alpha$2≤3.5).

The second oxide semiconductor film 108b can be formed using the sputtering target having an atomic ratio of In:M:Zn=1:1:1, In:M:Zn=1:1:1.2, or the like. It is preferable that the second oxide semiconductor film 108b have an atomic ratio of In:M:Zn=1:$\beta$1 (0.8≤$\beta$1≤1.2):$\beta$2 (0.8≤$\beta$2≤1.2). Note that the atomic ratio of metal elements in the sputtering target used for forming the second oxide semiconductor film 108b does not necessarily satisfy In M and Zn M, and may satisfy In<M or Zn<M. For example, the sputtering target can have an atomic ratio of In:M:Zn=1:3:2, In:M:Zn=1:3:4, or In:M:Zn=1:3:6.

The energy gap of the oxide semiconductor film 108 is 2 eV or more, preferably 2.5 eV or more, further preferably 3 eV or more. With the use of an oxide semiconductor having such a wide energy gap, the off-state current of the transistor 100 can be reduced. In particular, an oxide semiconductor film having an energy gap more than or equal to 2 eV, preferably more than or equal to 2 eV and less than or equal to 3.0 eV is preferably used as the first oxide semiconductor film 108a, and an oxide semiconductor film having an energy gap more than or equal to 2.5 eV and less than or equal to 3.5 eV is preferably used as the second oxide semiconductor film 108b. Furthermore, the energy gap of the second oxide semiconductor film 108b is preferably larger than that of the first oxide semiconductor film 108a.

The thickness of each of the first oxide semiconductor film 108a and the second oxide semiconductor film 108b is greater than or equal to 3 nm and less than or equal to 200 nm, preferably greater than or equal to 3 nm and less than or equal to 100 nm, further preferably greater than or equal to 3 nm and less than or equal to 50 nm.

An oxide semiconductor film with a low carrier density is used as the first oxide semiconductor film 108a so that the carrier density of the first oxide semiconductor film 108a can be higher than or equal to $1\times10^{-9}/cm^3$ and lower than $8\times10^{11}/cm^3$, preferably higher than or equal to $1\times10^{-9}/cm^3$ and lower than $1\times10^{11}/cm^3$, further preferably higher than or equal to $1\times10^{-9}/cm^3$ and lower than $1\times10^{10}/cm^3$. An oxide semiconductor film with a low carrier density is used as the second oxide semiconductor film 108b so that the carrier density of the second oxide semiconductor film 108b can be $1\times10^{17}/cm^3$ or lower, preferably $1\times10^{15}/cm^3$ or lower, further preferably $1\times10^{13}/cm^3$ or lower, still further preferably $1\times10^{11}/cm^3$ or lower.

Note that the composition is not limited to the above, and it is possible to use an oxide semiconductor film with an appropriate composition depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of each of the first oxide semiconductor film 108a and the second oxide semiconductor film 108b be set to be appropriate values.

Note that it is preferable to use, as each of the first oxide semiconductor film 108a and the second oxide semiconductor film 108b, an oxide semiconductor film in which the impurity concentration is low and the density of defect states is low, in which case the transistor can have more excellent electrical characteristics. Here, the state in which the impurity concentration is low and the density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, a highly purified intrinsic or substantially highly purified intrinsic oxide semiconductor film has an extremely low off-state current. The off-state current of an element having a channel width of $1\times10^6$ μm and a channel length L of 10 μm can be less than or equal to the measurement limit of a semiconductor parameter analyzer, i.e., less than or equal to $1\times10^{-13}$ A at a voltage between a source electrode and a drain electrode (drain voltage) of 1 V to 10 V.

Accordingly, the transistor in which the channel region is formed in the highly purified intrinsic or substantially highly purified intrinsic oxide semiconductor film can have a small variation in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. Examples of impurities are hydrogen, nitrogen, alkali metal, and alkaline earth metal.

Hydrogen contained in the oxide semiconductor film reacts with oxygen bonded to a metal atom to form water, and also causes oxygen vacancies in a lattice from which oxygen is released (or a portion from which oxygen is released). Due to entry of hydrogen into the oxygen vacancies, electrons serving as carriers are generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, the hydrogen concentration in the oxide semiconductor film 108, which is measured by SIMS, is lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$, yet further preferably lower than or equal to $1\times10^{18}$ atoms/$cm^3$, even further preferably lower than or equal to $5\times10^{17}$ atoms/$cm^3$, or further preferably lower than or equal to $1\times10^{16}$ atoms/$cm^3$.

The first oxide semiconductor film 108a preferably includes a region having lower hydrogen concentration than the second oxide semiconductor film 108b. When the first oxide semiconductor film 108a includes the region having lower hydrogen concentration than the second oxide semiconductor film 108b, the semiconductor device can be highly reliable.

When silicon or carbon that is one of elements belonging to Group 14 is contained in the first oxide semiconductor film 108a, oxygen vacancies are increased in the first oxide semiconductor film 108a, and the first oxide semiconductor film 108a becomes an n-type film. Thus, the concentration of silicon or carbon (the concentration is measured by SIMS) in the first oxide semiconductor film 108a or the concentration of silicon or carbon (the concentration is measured by SIMS) in the vicinity of an interface with the first oxide semiconductor film 108a is set to be lower than or equal to $2\times10^{18}$ atoms/$cm^3$, preferably lower than or equal to $2\times10^{17}$ atoms/$cm^3$.

In addition, the concentration of alkali metal or alkaline earth metal in the first oxide semiconductor film 108a, which is measured by SIMS, is lower than or equal to $1\times10^{18}$ atoms/$cm^3$, preferably lower than or equal to $2\times10^{16}$ atoms/$cm^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the first oxide semiconductor film 108a.

Furthermore, when including nitrogen, the first oxide semiconductor film 108a easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5\times10^{18}$ atoms/$cm^3$.

Each of the first oxide semiconductor film 108a and the second oxide semiconductor film 108b may have a non-single-crystal structure, for example. The non-single-crystal structure includes a c-axis aligned crystalline oxide semiconductor (CAAC-OS) which is described later, a polycrystalline structure, a microcrystalline structure, or an amorphous structure, for example. Among the non-single-crystal structures, the amorphous structure has the highest density of defect states, whereas CAAC-OS has the lowest density of defect states.

Here, a band structure including the oxide semiconductor film 108 and the insulating films in contact with the oxide semiconductor film 108 is described with reference to FIG. 8.

Figure 8:
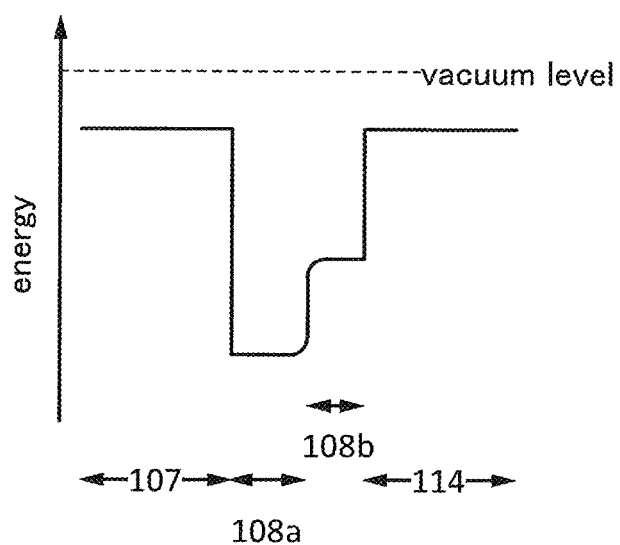
FIG. 8 shows a band structure.

FIG. 8 shows an example of a band structure in the thickness direction of a stack including the insulating film 107, the first oxide semiconductor film 108a, the second oxide semiconductor film 108b, and the insulating film 114. For easy understanding, energy level of the conduction band minimum ($E_c$) of each of the insulating film 107, the first oxide semiconductor film 108a, the second oxide semiconductor film 108b, and the insulating film 114 is shown in the band structure.

In the band structure of FIG. 8, a silicon oxide film is used as each of the insulating films 107 and 114, an oxide semiconductor film formed using a metal oxide target having an atomic ratio of metal elements of In:Ga:Zn=4:2:4.1 is used as the first oxide semiconductor film 108a, and a metal oxide film formed using a metal oxide target having an atomic ratio of metal elements of In:Ga:Zn=1:1:1.2 is used as the second oxide semiconductor film 108b.

As illustrated in FIG. 8, the energy level of the conduction band minimum gradually varies between the first oxide semiconductor film 108a and the second oxide semiconductor film 108b. In other words, the energy level of the conduction band minimum is continuously varied or continuously connected. To obtain such a band structure, there exists no impurity, which forms a defect state such as a trap center or a recombination center, at the interface between the first oxide semiconductor film 108a and the second oxide semiconductor film 108b.

To form a continuous junction between the first oxide semiconductor film 108a and the second oxide semiconductor film 108b, the films are formed successively without exposure to the air by using a multi-chamber deposition apparatus (sputtering apparatus) provided with a load lock chamber.

With the band structure of FIG. 8, the first oxide semiconductor film 108a serves as a well, and a channel region is formed in the first oxide semiconductor film 108a in the transistor with the layered structure.

In the case where the second oxide semiconductor film 108b is not provided, trap states might be formed in the first oxide semiconductor film 108a. However, in the above layered structure, the trap states can be formed in the second oxide semiconductor film 108b. Thus, the trap states can be distanced away from the first oxide semiconductor film 108a.

In addition, the trap states might be more distant from the vacuum level than the energy level of the conduction band minimum ($E_c$) of the first oxide semiconductor film 108a functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the energy level of the trap states be closer to the vacuum level than the energy level of the conduction band minimum ($E_c$) of the first oxide semiconductor film 108a. Such a structure inhibits accumulation of electrons in the trap states. As a result, the on-state current and the field-effect mobility of the transistor can be increased.

In FIG. 8, the energy level of the conduction band minimum of the second oxide semiconductor film 108b is closer to the vacuum level than that of the first oxide semiconductor film 108a. Typically, a difference in energy level between the conduction band minimum of the first oxide semiconductor film 108a and the conduction band minimum of the second oxide semiconductor film 108b is 0.15 eV or more or 0.5 eV or more and 2 eV or less or 1 eV or less. That is, the difference between the electron affinity of the second oxide semiconductor film 108b and the electron affinity of the first oxide semiconductor film 108a is 0.15 eV or more or 0.5 eV or more and 2 eV or less or 1 eV or less.

In such a structure, the first oxide semiconductor film 108a serves as a main path of current and functions as a channel region. In addition, since the second oxide semiconductor film 108b includes one or more metal elements included in the first oxide semiconductor film 108a in which a channel region is formed, interface scattering is less likely to occur at the interface between the first oxide semiconductor film 108a and the second oxide semiconductor film 108b. Thus, the transistor can have high field-effect mobility because the movement of carriers is not hindered at the interface.

To prevent the second oxide semiconductor film 108b from functioning as part of a channel region, a material having sufficiently low conductivity is used for the second oxide semiconductor film 108b. Alternatively, a material which has a smaller electron affinity (a difference in energy level between the vacuum level and the conduction band minimum) than the first oxide semiconductor film 108a and has a difference in energy level in the conduction band minimum from the first oxide semiconductor film 108a (band offset) is used for the second oxide semiconductor film 108b. Furthermore, to inhibit generation of a difference between threshold voltages due to the value of the drain voltage, it is preferable to form the second oxide semiconductor film 108b using a material whose energy level of the conduction band minimum is closer to the vacuum level than that of the first oxide semiconductor film 108a by 0.2 eV or more, preferably 0.5 eV or more.

It is preferable that the second oxide semiconductor film 108b not have a spinel crystal structure. This is because if the second oxide semiconductor film 108b has a spinel crystal structure, constituent elements of the conductive films 112a and 112b might be diffused into the first oxide semiconductor film 108a at the interface between the spinel crystal structure and another region. Note that the second oxide semiconductor film 108b is preferably a CAAC-OS, which is described later, in which case a higher blocking property against constituent elements of the conductive films 112a and 112b, for example, a copper element, is obtained.

The thickness of the second oxide semiconductor film 108b is large enough to inhibit diffusion of the constituent elements of the conductive films 112a and 112b into the first oxide semiconductor film 108a and small enough not to inhibit supply of oxygen from the insulating film 114 to the first oxide semiconductor film 108a. For example, when the thickness of the second oxide semiconductor film 108b is greater than or equal to 10 nm, diffusion of the constituent elements of the conductive films 112a and 112b into the first oxide semiconductor film 108a can be inhibited. When the thickness of the second oxide semiconductor film 108b is less than or equal to 100 nm, oxygen can be effectively supplied from the insulating films 114 and 116 to the first oxide semiconductor film 108a.

<Insulating Films Functioning as Protective Insulating Films for Transistor>

The insulating films 114 and 116 each have a function of supplying oxygen to the oxide semiconductor film 108. The insulating film 118 functions as a protective insulating film for the transistor 100. The insulating films 114 and 116 contain oxygen. Furthermore, the insulating film 114 is an insulating film which is permeable to oxygen. Note that the insulating film 114 also functions as a film which relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114.

In addition, it is preferable that the number of defects in the insulating film 114 be small and typically, the spin density corresponding to a signal that appears at g=2.001 due to a dangling bond of silicon be lower than or equal to $3 \times 10^{17}$ spins/cm$^3$ by ESR measurement. This is because if the density of defects in the insulating film 114 is high, oxygen is bonded to the defects and the amount of oxygen that passes through the insulating film 114 is decreased.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 is moved to the outside of the insulating film 114. When an oxide insulating film which can transmit oxygen is formed as the insulating film 114, oxygen released from the insulating film 116 provided over the insulating film 114 can be moved to the oxide semiconductor film 108 through the insulating film 114.

The insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, or the like can be used as the above oxide insulating film.

Note that a silicon oxynitride film that releases less nitrogen oxide is a film which releases more ammonia than the nitrogen oxide in thermal desorption spectroscopy analysis; the number of ammonia molecules released from the silicon oxynitride film is typically greater than or equal to $1 \times 10^{18}$/cm$^3$ and less than or equal to $5 \times 10^{19}$/cm$^3$. Note that the number of ammonia molecules released from a film is the number of ammonia molecules released by heat treatment with which the surface temperature of the film becomes higher than or equal to 50° C. and lower than or equal to 650° C., preferably higher than or equal to 50° C. and lower than or equal to 550° C.

Nitrogen oxide (NO$_x$; x is greater than or equal to 0 and less than or equal to 2, preferably greater than or equal to 1 and less than or equal to 2), typically NO$_2$ or NO, forms levels in the insulating film 114, for example. The level is positioned in the energy gap of the oxide semiconductor film 108. Therefore, when nitrogen oxide is diffused to the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the interface between the insulating film 114 and the oxide semiconductor film 108.

By using the above oxide insulating film for the insulating film 114, a shift in the threshold voltage of the transistor can be reduced, which leads to reduced fluctuations in the electrical characteristics of the transistor.

Note that in an ESR spectrum at 100 K or lower of the insulating film 114, by heat treatment of a manufacturing process of the transistor, typically heat treatment at a temperature lower than 400° C. or lower than 375° C. (preferably, higher than or equal to 340° C. and lower than or equal to 360° C.), a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the smaller amount of nitrogen oxide the oxide insulating film contains.

The nitrogen concentration in the above oxide insulating film measured by SIMS is lower than or equal to $6 \times 10^{20}$ atoms/cm$^3$.

The above oxide insulating film is formed by a PECVD method at a substrate temperature higher than or equal to 220° C. and lower than or equal to 350° C. using silane and dinitrogen monoxide, whereby a dense and hard film can be formed.

The insulating film 116 is formed using an oxide insulating film that contains oxygen in excess of that in the stoichiometric composition. Part of oxygen is released by heating from the oxide insulating film containing oxygen in excess of that in the stoichiometric composition. The oxide insulating film containing oxygen in excess of that in the stoichiometric composition is an oxide insulating film of which the amount of released oxygen converted into oxygen atoms is greater than or equal to $1.0 \times 10^{19}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the number of defects in the insulating film 116 be small, and typically the spin density corresponding to a signal which appears at g=2.001 due to a dangling bond of silicon be lower than $1.5 \times 10^{18}$ spins/cm$^3$, preferably lower than or equal to $1 \times 10^{18}$ spins/cm$^3$ by ESR measurement. Note that the insulating film 116 is provided more apart from the oxide semiconductor film 108 than the insulating film 114 is; thus, the insulating film 116 may have higher density of defects than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this structure. For example, a single-layer structure of either one of the insulating films 114 and 116 may be employed.

The insulating film 118 has a function of blocking oxygen, hydrogen, water, alkali metal, alkaline earth metal, and the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118. A nitride insulating film, for example, can be used as the insulating film 118. The nitride insulating film is formed using silicon nitride, silicon nitride oxide, aluminum nitride, aluminum nitride oxide, or the like. In particular, a silicon nitride oxide film or a silicon nitride film is preferably used as the insulating film 118, in which case outward diffusion of oxygen can be prevented.

Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided as the insulating film 118. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given. As the oxide insulating film having a blocking effect against oxygen, hydrogen, water, and the like, an aluminum oxide film, a hafnium oxide film, or an yttrium oxide film is particularly preferable.

Although the variety of films such as the conductive films, the insulating films, and the oxide semiconductor films which are described above can be formed by a sputtering method or a PECVD method, such films may be formed by another method, e.g., a thermal chemical vapor deposition (CVD) method or an atomic layer deposition (ALD) method. As an example of a thermal CVD method, a metal organic chemical vapor deposition (MOCVD) method can be given.

A thermal CVD method has an advantage that no defect due to plasma damage is generated since it does not utilize plasma for forming a film.

Deposition over a substrate by a thermal CVD method may be performed in such a manner that a source gas and an oxidizer are supplied to a chamber at a time, the pressure inside the chamber is set to an atmospheric pressure or a reduced pressure, and the source gas and the oxidizer react with each other in the vicinity of the substrate or over the substrate.

Deposition by an ALD method may be performed in such a manner that the pressure inside a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced when or after the first gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor film, and the metal oxide film in this embodiment can be formed by a thermal CVD method such as an MOCVD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, that is, ozone ($O_3$) as an oxidizer and a source gas which is obtained by vaporizing a liquid containing a solvent and a hafnium precursor compound (e.g., a hafnium alkoxide or a hafnium amide such as tetrakis(dimethylamide)hafnium (TDMAH)) are used. Note that the chemical formula of tetrakis(dimethylamide)hafnium is Hf[N(CH$_3$)$_2$]$_4$. Examples of another material liquid include tetrakis(ethylmethylamide)hafnium.

For example, in the case where an aluminum oxide film is formed by a deposition apparatus using an ALD method, two kinds of gases, e.g., H$_2$O as an oxidizer and a source gas which is obtained by vaporizing a liquid containing a solvent and an aluminum precursor compound (e.g., trimethylaluminum (TMA)) are used. Note that the chemical formula of trimethylaluminum is Al(CH$_3$)$_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus using an ALD method, hexachlorodisilane is adsorbed on a surface where a film is to be formed, chlorine included in the adsorbate is removed, and radicals of an oxidizing gas (e.g., O$_2$ or dinitrogen monoxide) are supplied to react with the adsorbate.

For example, in the case where a tungsten film is formed with a deposition apparatus using an ALD method, a WF$_6$ gas and a B$_2$H$_6$ gas are sequentially introduced a plurality of times to form an initial tungsten film, and then a WF$_6$ gas and an H$_2$ gas are used to form a tungsten film. Note that an SiH$_4$ gas may be used instead of a B$_2$H$_6$ gas.

For example, in the case where an oxide semiconductor film, e.g., an In—Ga—Zn—O film is formed with a deposition apparatus using an ALD method, an In(CH$_3$)$_3$ gas and an O$_3$ gas are sequentially introduced a plurality of times to form an In—O layer, then a Ga(CH$_3$)$_3$ gas and an O$_3$ gas are used to form a GaO layer, and then a Zn(CH$_3$)$_2$ gas and an O$_3$ gas are used to form a ZnO layer. Note that the order of these layers is not limited to this example. A mixed compound layer such as an In—Ga—O layer, an In—Zn—O layer, or a Ga—Zn—O layer may be formed by mixing these gases. Note that although an H$_2$O gas which is obtained by bubbling with an inert gas such as Ar may be used instead of an O$_3$ gas, it is preferable to use an O$_3$ gas, which does not contain H. Furthermore, instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Furthermore, a Zn(CH$_3$)$_2$ gas may be used.

<Structural Example 2 of Semiconductor Device>

A structure example different from that of the transistor 100 in FIGS. 5B and 5C will be described with reference to FIGS. 6A and 6B. Note that in the case where a portion has a function similar to that described above, the same hatch pattern is applied to the portion, and the portion is not especially denoted by a reference numeral in some cases.

Figure 6A:
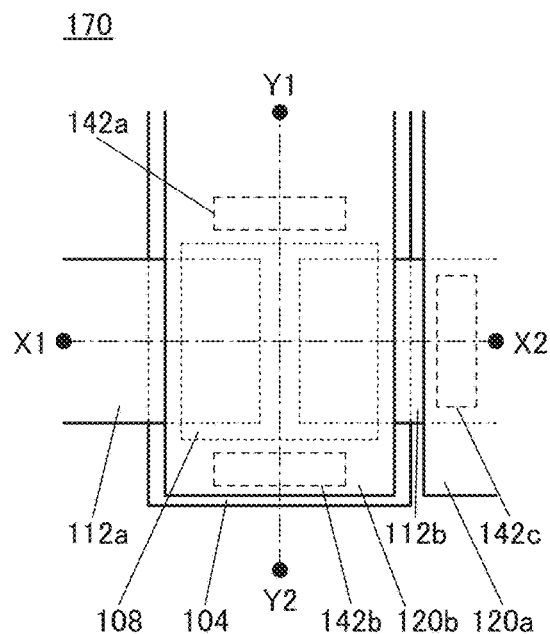
FIGS. 6A and 6B are a top view and cross-sectional views illustrating one embodiment of a semiconductor device.

FIG. 6A is a top view of a transistor 170 that is a semiconductor device of one embodiment of the present invention. FIG. 6B is a cross-sectional view taken along the dashed-dotted line X1-X2 in FIG. 6A, and a cross-sectional view taken along the dashed-dotted line Y1-Y2 in FIG. 6A. In FIG. 6B, the cross-sectional view taken along the dashed-dotted line X1-X2 and the cross-sectional view taken along the dashed-dotted line Y1-Y2 are illustrated on the left side and the right side, respectively.

The transistor 170 includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, the insulating film 114 over the oxide semiconductor film 108, the insulating film 116 over the insulating film 114, the conductive film 112a functioning as a source electrode electrically connected to the oxide semiconductor film 108, the conductive film 112b functioning as a drain electrode electrically connected to the oxide semiconductor film 108, the insulating film 118 over the insulating film 116, a conductive film 120a over the insulating film 118, and a conductive film 120b over the insulating film 118. The insulating films 114, 116, and 118 function as second gate insulating films of the transistor 170. The conductive film 120a is electrically connected to the conductive film 112b through an opening 142c provided in the insulating films 114, 116, and 118. The conductive film 120a in the transistor 170 functions as, for example, a pixel electrode used for a display device. The conductive film 120b in the transistor 170 functions as a second gate electrode (also referred to as a back gate electrode).

Figure 6B:
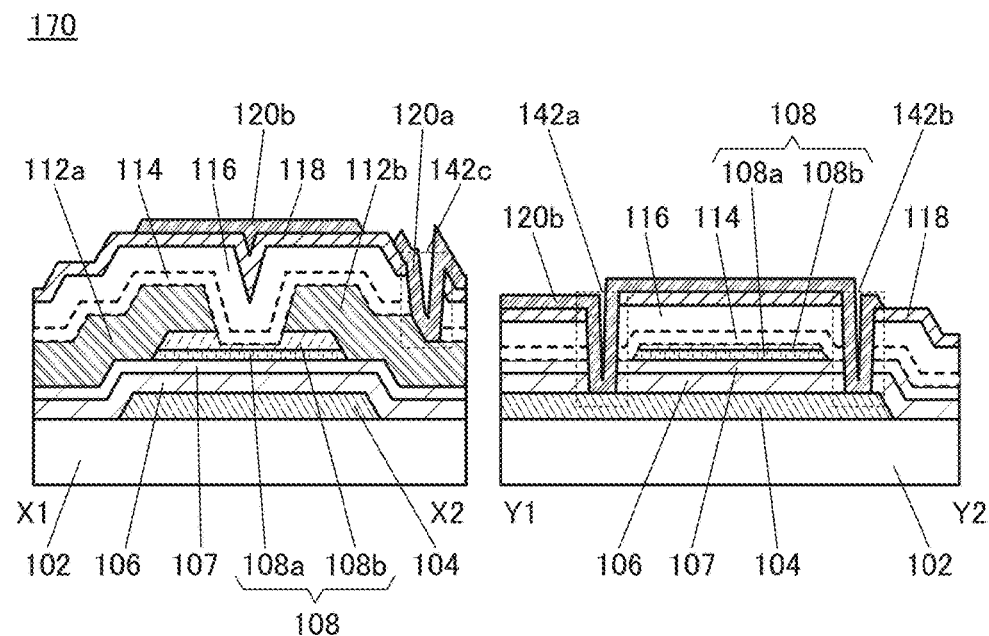

As illustrated in the cross-sectional view on the right side in FIG. 6B, the conductive film 120b is connected to the conductive film 104 functioning as a first gate electrode through openings 142a and 142b provided in the insulating films 106, 107, 114, 116, and 118. Accordingly, the conductive film 120b and the conductive film 104 are supplied with the same potential.

Note that although the structure in which the openings 142a and 142b are provided so that the conductive film 120b and the conductive film 104 are connected to each other is described in this embodiment, one embodiment of the present invention is not limited thereto. For example, a structure in which only one of the openings 142a and 142b is provided so that the conductive film 120b and the conductive film 104 are connected to each other, or a structure in which the openings 142a and 142b are not provided and the conductive film 120b and the conductive film 104 are not connected to each other may be employed. Note that in the case where the conductive film 120b and the conductive film 104 are not connected to each other, it is possible to apply different potentials to the conductive film 120b and the conductive film 104.

As illustrated in the cross-sectional view on the left side in FIG. 6B, the oxide semiconductor film 108 is positioned to face each of the conductive film 104 functioning as a first gate electrode and the conductive film 120b functioning as a second gate electrode, and is sandwiched between the two conductive films functioning as gate electrodes. The lengths in the channel length direction and the channel width direction of the conductive film 120b functioning as a second gate electrode are longer than those in the channel length direction and the channel width direction of the oxide semiconductor film 108. The whole oxide semiconductor film 108 is covered with the conductive film 120b with the insulating films 114, 116, and 118 positioned therebetween. Since the conductive film 120b functioning as a second gate electrode is connected to the conductive film 104 functioning as a first gate electrode through the openings 142a and 142b provided in the insulating films 106, 107, 114, 116, and 118, a side surface of the oxide semiconductor film 108 in the channel width direction faces the conductive film 120b functioning as a second gate electrode with the insulating films 114, 116, and 118 positioned therebetween.

In other words, in the channel width direction of the transistor 170, the conductive film 104 functioning as a first gate electrode and the conductive film 120b functioning as a second gate electrode are connected to each other through the openings provided in the insulating films 106 and 107 functioning as first gate insulating films, and the insulating films 114, 116, and 118 functioning as second gate insulating films; and the conductive film 104 and the conductive film 120b surround the oxide semiconductor film 108 with the insulating films 106 and 107 functioning as first gate insulating films, and the insulating films 114, 116, and 118 functioning as second gate insulating films positioned therebetween.

With such a structure, the oxide semiconductor film 108 included in the transistor 170 can be electrically surrounded by electric fields of the conductive film 104 functioning as a first gate electrode and the conductive film 120b functioning as a second gate electrode. A device structure of a transistor, like that of the transistor 170, in which electric fields of a first gate electrode and a second gate electrode electrically surround an oxide semiconductor film where a channel region is formed can be referred to as a surrounded channel (s-channel) structure.

Since the transistor 170 has the s-channel structure, an electric field for inducing a channel can be effectively applied to the oxide semiconductor film 108 by the conductive film 104 functioning as a first gate electrode; therefore, the current drive capability of the transistor 170 can be improved and high on-state current characteristics can be obtained. Since the on-state current can be increased, it is possible to reduce the size of the transistor 170. In addition, since the transistor 170 has a structure in which the oxide semiconductor film 108 is surrounded by the conductive film 104 functioning as a first gate electrode and the conductive film 120b functioning as a second gate electrode, the mechanical strength of the transistor 170 can be increased.

Note that the other components of the transistor 170 are the same as those of the transistor 100 described above, and an effect similar to that of the transistor 100 can be obtained.

The structures of the transistors of this embodiment can be freely combined with each other. For example, the transistor 100 illustrated in FIGS. 5A and 5B can be used as a transistor in a pixel of a display device, and the transistor 170 illustrated in FIGS. 6A and 6B can be used as a transistor in a gate driver of the display device.

<Method 1 for Manufacturing Semiconductor Device>

Next, a method for manufacturing the transistor 100 that is a semiconductor device of one embodiment of the present invention will be described in detail with reference to FIGS. 1A to 1C, FIGS. 2A to 2C, FIGS. 3A to 3C, FIGS. 4A to 4C, and FIG. 5A. Note that FIGS. 1A to 1C, FIGS. 2A to 2C, FIGS. 3A to 3C, FIGS. 4A to 4C, and FIG. 5A are cross-sectional views illustrating the method for manufacturing the semiconductor device.

First, a conductive film is formed over the substrate 102 and processed through a lithography process and an etching process, whereby the conductive film 104 functioning as a gate electrode is formed. Then, the insulating films 106 and 107 functioning as gate insulating films are formed over the conductive film 104 (see FIG. 1A).

In this embodiment, a glass substrate is used as the substrate 102, and as the conductive film 104 functioning as a gate electrode, a 100-nm-thick tungsten film is formed by a sputtering method. A 400-nm-thick silicon nitride film as the insulating film 106 and a 50-nm-thick silicon oxynitride film as the insulating film 107 are formed by a PECVD method.

Note that the insulating film 106 can have a layered structure of silicon nitride films. Specifically, the insulating film 106 can have a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and a power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and a power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and a power of 2000 W is supplied using a 27.12 MHz high-frequency power source.

Note that the first silicon nitride film, the second silicon nitride film, and the third silicon nitride film can each be formed at a substrate temperature of 350° C. or lower.

When the insulating film 106 has the three-layer structure of silicon nitride films, for example, in the case where a conductive film containing copper (Cu) is used as the conductive film 104, the following effect can be obtained.

The first silicon nitride film can inhibit diffusion of a copper (Cu) element from the conductive film 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

The insulating film 107 is preferably an insulating film containing oxygen to improve characteristics of an interface with the oxide semiconductor film 108 (specifically, the first oxide semiconductor film 108a) formed later.

Next, over the insulating film 107, an oxide semiconductor film 109 is formed at a first temperature. The oxide semiconductor film 109 is formed in such a manner that a first oxide semiconductor film 109a is formed first and then a second oxide semiconductor film 109b is formed (see FIG. 1B).

The first temperature at which the oxide semiconductor film 109 is formed is higher than or equal to room temperature and lower than 340° C., preferably higher than or equal to room temperature and lower than or equal to 300° C., more preferably higher than or equal to 100° C. and lower than or equal to 250° C., and still more preferably higher than or equal to 100° C. and lower than or equal to 200° C. The oxide semiconductor film 109 is formed while heat treatment is performed, so that the crystallinity of the oxide semiconductor film 109 can be improved. In the case where a large-sized glass substrate (for example, any of glass substrates of the 6th to 10th generations) is used as the substrate 102, the substrate 102 is sometimes distorted when the first temperature is higher than or equal to 150° C. and lower than 340° C. However, even in the case where a large-sized glass substrate is used, distortion of the glass substrate can be prevented when the first temperature is higher than or equal to 100° C. and lower than 150° C.

The first oxide semiconductor film 109a and the second oxide semiconductor film 109b are formed at either the same substrate temperature or different substrate temperatures. Preferably, the first oxide semiconductor film 109a and the second oxide semiconductor film 109b are formed at the same substrate temperature because manufacturing cost can be reduced.

In this embodiment, the first oxide semiconductor film 109a is formed by a sputtering method using an In—Ga—Zn metal oxide target (having an atomic ratio of In:Ga:Zn=4:2:4.1), and then the second oxide semiconductor film 109b is successively formed in a vacuum by a sputtering method using an In—Ga—Zn metal oxide target (having an atomic ratio of In:Ga:Zn=1:1:1.2). The first oxide semiconductor film 109a and the second oxide semiconductor film 109b are formed at a substrate temperature of 170° C.

In the case where the oxide semiconductor film 109 is formed by a sputtering method, a rare gas (typically argon), oxygen, or a mixed gas of a rare gas and oxygen is used as a sputtering gas, as appropriate. In the case of using the mixed gas of a rare gas and oxygen, the proportion of oxygen to a rare gas is preferably increased. In addition, increasing the purity of a sputtering gas is necessary. For example, as an oxygen gas or an argon gas used for a sputtering gas, a gas which is highly purified to have a dew point of −40° C. or lower, preferably −80° C. or lower, further preferably −100° C. or lower, and still further preferably −120° C. or lower is used, whereby entry of moisture and the like into the oxide semiconductor film 109 can be minimized.

In the case where the oxide semiconductor film 109 is formed by a sputtering method, a chamber in a sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity for the oxide semiconductor film 109, as much as possible. Alternatively, a turbo molecular pump and a cold trap are preferably combined so as to prevent a backflow of a gas, especially a gas containing carbon or hydrogen, from an exhaust system to the inside of the chamber.

Then, the oxide semiconductor film 109 is processed, so that the island-shaped oxide semiconductor film 108 is formed. Note that the first oxide semiconductor film 109a is processed into the island-shaped first oxide semiconductor film 108a, and the second oxide semiconductor film 109b is processed into the island-shaped second oxide semiconductor film 108b (see FIG. 1C).

Figure 2A:
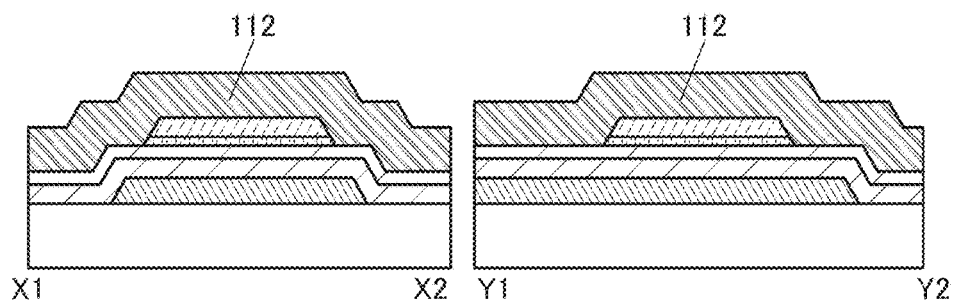
FIGS. 2A to 2C are cross-sectional views illustrating an example of a manufacturing process of a semiconductor device.

After that, heat treatment at a temperature higher than the first temperature is not performed, and a conductive film 112 to be the source electrode and the drain electrode is formed over the insulating film 107 and the oxide semiconductor film 108 by a sputtering method (see FIG. 2A). In other words, the temperature of steps after processing the oxide semiconductor film 109 for forming the island-shaped oxide semiconductor film 108, and before forming the conductive film 112 is lower than or equal to the first temperature.

In this embodiment, as the conductive film 112, a layered film in which a 50-nm-thick tungsten film and a 400-nm-thick aluminum film are sequentially stacked is formed by a sputtering method. Although the conductive film 112 has a two-layer structure in this embodiment, one embodiment of the present invention is not limited thereto. For example, the conductive film 112 may have a three-layer structure in which a 50-nm-thick tungsten film, a 400-nm-thick aluminum film, and a 100-nm-thick titanium film are sequentially stacked.

Figure 2B:
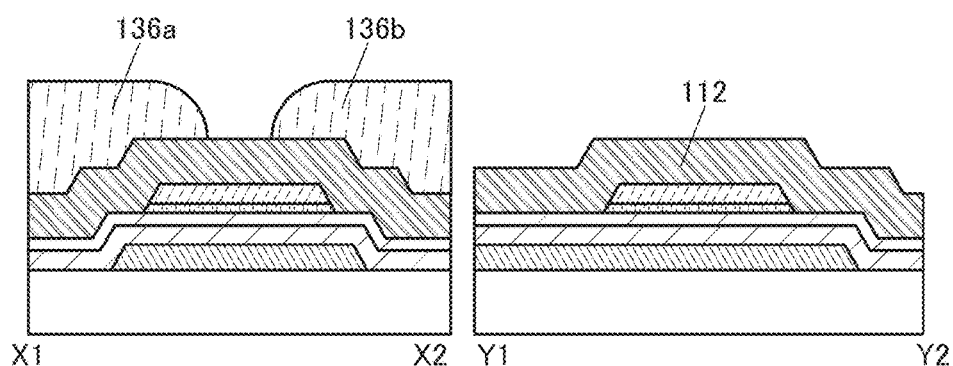

Next, masks 136a and 136b are formed in desired regions over the conductive film 112 (see FIG. 2B).

In this embodiment, the masks 136a and 136b are formed in such a manner that a photosensitive resin film is formed over the conductive film 112 and is patterned through a lithography process.

Figure 2C:
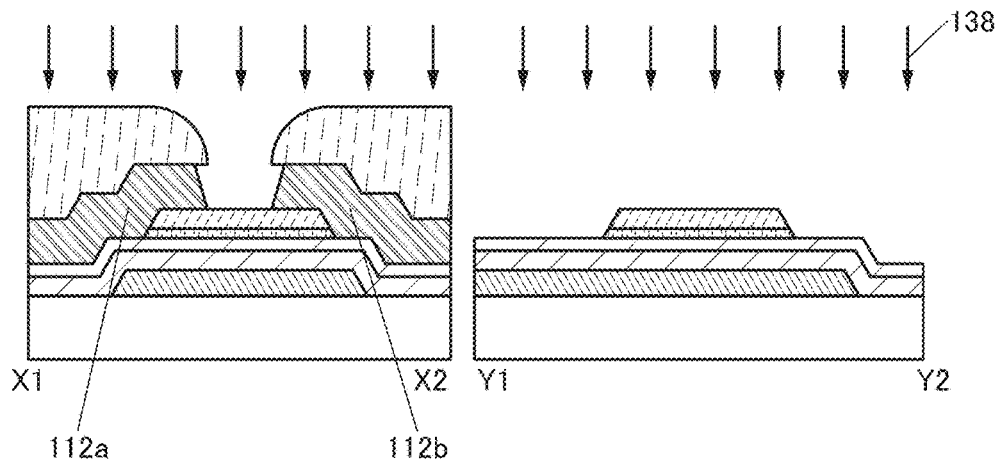

Then, an etching agent 138 is applied from above the conductive film 112 and the masks 136a and 136b so that the conductive film 112 is processed, whereby the conductive films 112a and 112b separated from each other are formed (see FIG. 2C).

In this embodiment, the conductive film 112 is processed with a dry etching apparatus. Note that a method for processing the conductive film 112 is not limited thereto. For example, the conductive film 112 and the second oxide semiconductor film 108b may be processed using a chemical solution as the etching agent 138 with an wet etching apparatus. Note that a finer pattern can be formed when a dry etching apparatus is used for processing the conductive film 112 than when a wet etching apparatus is used. However, when a wet etching apparatus is used for processing the conductive film 112, manufacturing cost can be more reduced than when a dry etching apparatus is used.

Figure 3A:
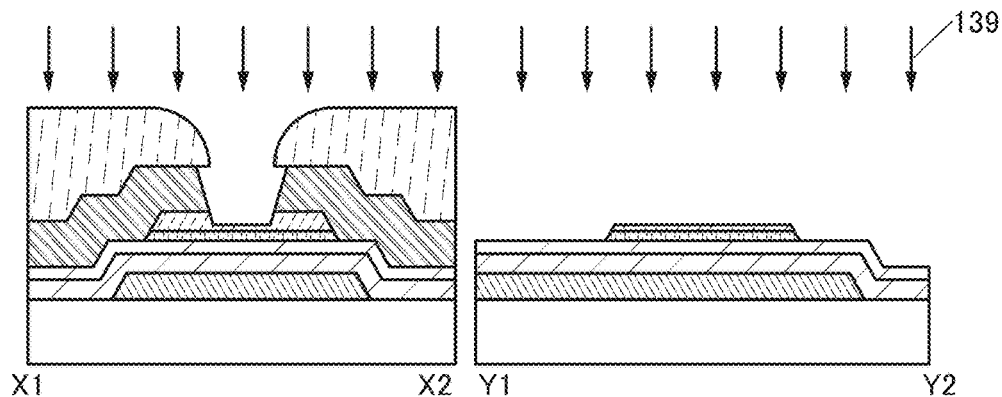
FIGS. 3A to 3C are cross-sectional views illustrating an example of a manufacturing process of a semiconductor device.
Figure 3B:
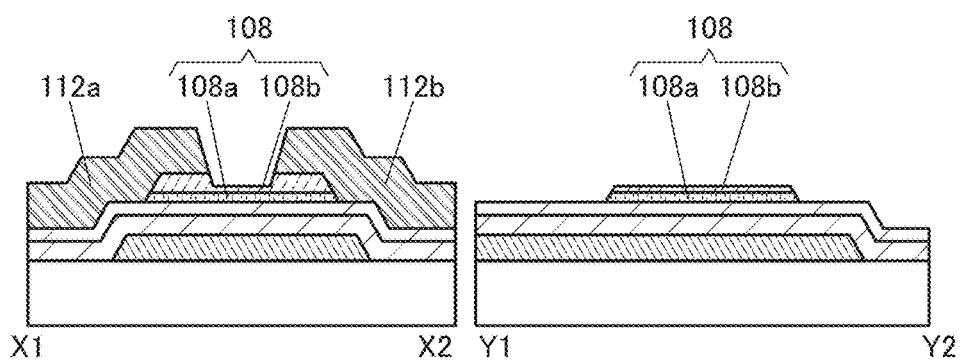

Then, an etching agent 139 is applied from above the second oxide semiconductor film 108b, the conductive films 112a and 112b, and the masks 136a and 136b to clean a surface of the second oxide semiconductor film 108b (on the back channel side) (see FIG. 3A).

The cleaning may be performed, for example, using a chemical solution such as phosphoric acid. The cleaning using a chemical solution such as phosphoric acid can remove impurities (e.g., an element included in the conductive films 112a and 112b) attached to the surface of the second oxide semiconductor film 108b. Note that the cleaning is not necessarily performed; in some cases, the cleaning does not need to be performed.

Through the formation and/or the cleaning of the conductive films 112a and 112b, a region of the second oxide semiconductor film 108b which is not covered with the conductive film 112a or 112b sometimes becomes thinner than the first oxide semiconductor film 108a.

Figure 9A:
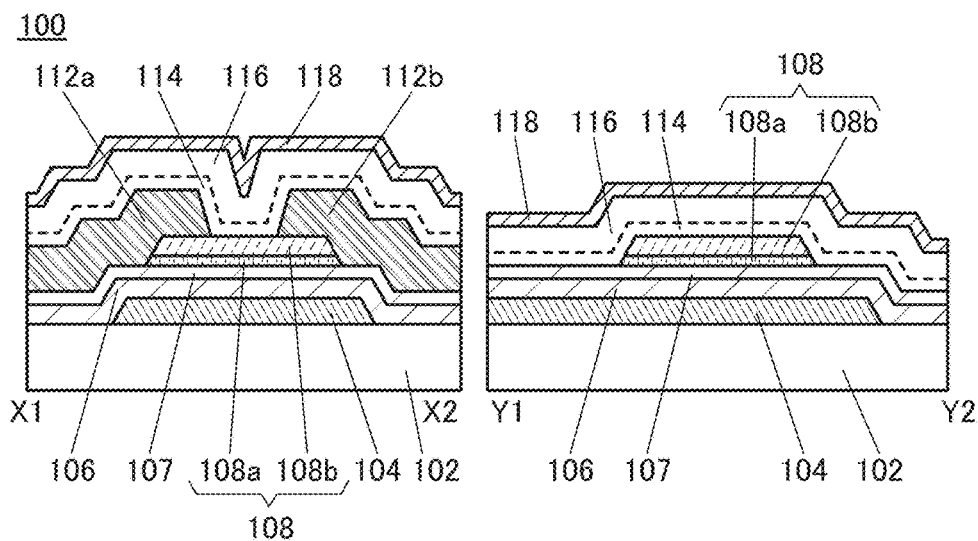
FIGS. 9A and 9B are cross-sectional views illustrating embodiments of a semiconductor device.
Figure 9B:
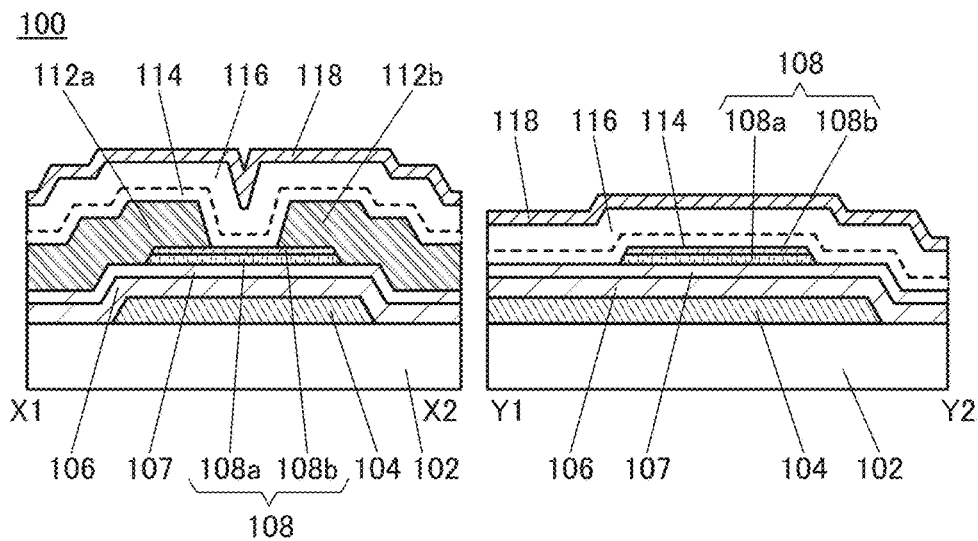

However, through the formation and/or the cleaning of the conductive films 112a and 112b, the region of the second oxide semiconductor film 108b which is not covered with the conductive film 112a or 112b sometimes does not become thinner than a region of the second oxide semiconductor film 108b which is covered with the conductive film 112a or 112b. FIGS. 9A and 9B illustrate examples of such a case. FIGS. 9A and 9B are cross-sectional views illustrating examples of a semiconductor device. In each of FIGS. 9A and 9B, a cross-sectional view taken along the dashed-dotted line X1-X2 and a cross-sectional view taken along the dashed-dotted line Y1-Y2 are illustrated on the left side and the right side, respectively. FIG. 9A illustrates an example in which the second oxide semiconductor film 108b of the transistor 100 illustrated in FIG. 5B does not become thinner than the region of the second oxide semiconductor film 108b which is covered with the conductive film 112a or 112b. FIG. 9B illustrates an example in which the thickness of the second oxide semiconductor film 108b is made smaller than that of the first oxide semiconductor film 108a in advance and the thickness of the region which is not covered with the conductive film 112a or 112b is substantially the same as that in the transistor 100 illustrated in FIG. 5B.

Then, the masks 136a and 136b are removed, whereby the conductive film 112a functioning as the source electrode and the conductive film 112b functioning as the drain electrode are formed over the second oxide semiconductor film 108b. The oxide semiconductor film 108 has a layered structure of the first oxide semiconductor film 108a and the second oxide semiconductor film 108b (see FIG. 3B).

Figure 3C:
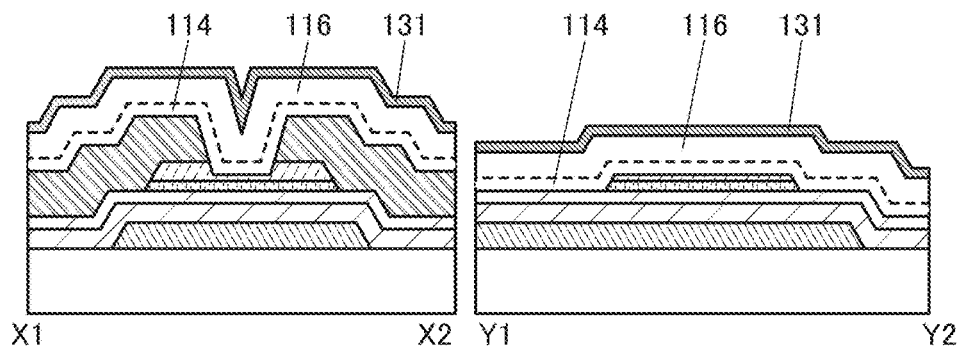

Next, the insulating film 114 functioning as the first protective insulating film and the insulating film 116 functioning as the second protective insulating film are formed over the oxide semiconductor film 108 and the conductive films 112a and 112b, and then a first barrier film 131 is formed (see FIG. 3C).

Note that after the insulating film 114 is formed, the insulating film 116 is preferably formed in succession without exposure to the air. After the insulating film 114 is formed, the insulating film 116 is formed in succession by adjusting at least one of the flow rate of a source gas, pressure, a high-frequency power, and a substrate temperature without exposure to the air, whereby the concentration of impurities attributed to the atmospheric component at the interface between the insulating film 114 and the insulating film 116 can be reduced, and oxygen in the insulating films 114 and 116 can be moved to the oxide semiconductor film 108; accordingly, the number of oxygen vacancies in the oxide semiconductor film 108 can be reduced.

For example, as the insulating film 114, a silicon oxynitride film can be formed by a PECVD method. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small number of defects can be formed as the insulating film 114 by a PECVD method under the conditions where the flow rate of the oxidizing gas is higher than 20 times and lower than 100 times, preferably higher than or equal to 40 times and lower than or equal to 80 times, that of the deposition gas; and the pressure in a process chamber is lower than 100 Pa, preferably lower than or equal to 50 Pa.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the process chamber is 20 Pa, and a high-frequency power of 100 W at 13.56 MHz ($1.6 \times 10^{-2}$ W/cm$^2$ as the power density) is supplied to parallel-plate electrodes.

As the insulating film 116, a silicon oxide film or a silicon oxynitride film is formed under the conditions where the substrate placed in a process chamber of the PECVD apparatus, which is vacuum-evacuated, is held at a temperature higher than or equal to 180° C. and lower than or equal to 350° C., the pressure is greater than or equal to 100 Pa and less than or equal to 250 Pa, preferably greater than or equal to 100 Pa and less than or equal to 200 Pa, with introduction of a source gas into the process chamber, and a high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$, is supplied to an electrode provided in the process chamber.

As the deposition conditions of the insulating film 116, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, an oxide insulating film which contains oxygen in excess of that in the stoichiometric composition and from which part of oxygen is released by heating can be formed.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the number of defects in the insulating film 116 can be reduced. Typically, it is possible to form an oxide insulating layer in which the number of defects is small, that is, the spin density of a signal which appears at g=2.001 owing to a dangling bond of silicon is lower than $6 \times 10^{17}$ spins/cm$^3$, preferably lower than or equal to $3 \times 10^{17}$ spins/cm$^3$, and further preferably lower than or equal to $1.5 \times 10^{17}$ spins/cm$^3$, by ESR measurement. As a result, the reliability of the transistor can be improved.

After the insulating films 114 and 116 are formed (i.e., after the insulating film 116 is formed and before the first barrier film 131 is formed), heat treatment may be performed. The heat treatment can reduce nitrogen oxide contained in the insulating films 114 and 116. By the heat treatment, part of oxygen contained in the insulating films 114 and 116 can be moved to the oxide semiconductor film 108, so that the number of oxygen vacancies in the oxide semiconductor film 108 can be reduced.

The temperature of the heat treatment performed on the insulating films 114 and 116 is typically lower than 400° C., preferably lower than 375° C., more preferably higher than or equal to 150° C. and lower than 360° C., and still more preferably higher than or equal to 350° C. and lower than 360° C. The heat treatment may be performed under an atmosphere of nitrogen, oxygen, ultra-dry air (air in which the water content is 20 ppm or less, preferably 1 ppm or less, more preferably 10 ppb or less), or a rare gas (argon, helium, or the like). Note that an electric furnace, an RTA apparatus, or the like can be used for the heat treatment, in which it is preferable that hydrogen, water, and the like not be contained in the nitrogen, oxygen, ultra-dry air, or a rare gas.

The first barrier film 131 contains oxygen and metal (at least one of indium, zin, titanium, aluminum, tungsten, tantalum, molybdenum, hafnium, and yttrium). Indium tin oxide (also referred to as ITO), indium tin silicon oxide (In—Sn—Si oxide, hereinafter also referred to as ITSO), or indium oxide is preferably used for the first barrier film 131 because unevenness can be favorably covered.

The first barrier film 131 can be formed by a sputtering method. When the first barrier film 131 is thin, it is sometimes difficult to inhibit release of oxygen from the insulating film 116 to the outside. In contrast, when the first barrier film 131 is thick, oxygen cannot be favorably added to the insulating film 116 in some cases. Therefore, the thickness of the first barrier film 131 is preferably greater than or equal to 1 nm and less than or equal to 20 nm, or greater than or equal to 2 nm and less than or equal to 10 nm. In this embodiment, a 5-nm-thick ITSO film is formed as the first barrier film 131.

After that, oxygen 140 is added to the insulating film 116 functioning as a second protective insulating film through the first barrier film 131. In FIG. 4A, oxygen added to the insulating film 116 is schematically shown as oxygen 140a.

As a method for adding the oxygen 140 to the insulating film 116 through the first barrier film 131, an ion doping method, an ion implantation method, a plasma treatment method, or the like can be used. The oxygen 140 may be excess oxygen, oxygen radicals, or the like. By the bias application to the substrate side when the oxygen 140 is added, the oxygen 140 can be effectively added to the insulating film 116. As the bias, for example, power density can be greater than or equal to 1 W/cm$^2$ and less than or equal to 5 W/cm$^2$. When the first barrier film 131 is provided over the insulating film 116 and then oxygen is added, the first barrier film 131 functions as a protective film for inhibiting release of oxygen from the insulating film 116. Thus, a larger amount of oxygen can be added to the insulating film 116.

Then, heat treatment is performed at a second temperature lower than 400° C., whereby the excess oxygen or oxygen radicals can be diffused into the oxide semiconductor film 108 (see FIG. 4B).

In FIG. 4B, the heat treatment at the second temperature is schematically shown with arrows 141. The second temperature is lower than 400° C., preferably lower than 375° C., more preferably higher than or equal to 340° C. and lower than 360° C. The heat treatment at the second temperature may be performed under an atmosphere of nitrogen, oxygen, ultra-dry air (air in which the water content is 20 ppm or less, preferably 1 ppm or less, more preferably 10 ppb or less), or a rare gas (argon, helium, or the like). Note that an electric furnace, an RTA apparatus, or the like can be used for the heat treatment, in which it is preferable that hydrogen, water, and the like not be contained in the nitrogen, oxygen, ultra-dry air, or rare gas.

In this embodiment, as the heat treatment at the second temperature, heat treatment at 350° C. is performed for one hour in a nitrogen atmosphere. Note that the second temperature at which the heat treatment is performed should be the highest in the manufacturing process of the transistor 100; however, heat treatment at a temperature substantially the same as the second temperature may be performed in another step. For example, the substrate temperature during the formation of the insulating films 106, 107, 114, 116, and 118 may be equal to the second temperature.

Next, the first barrier film 131 or part thereof, and part of the insulating film 116 functioning as the second protective insulating film are removed using an etching agent 142 (see FIG. 4C).

As a method for removing the first barrier film 131 and part of the insulating film 116 functioning as the second protective insulating film, a dry etching method, a wet etching method, a combination of a dry etching method and a wet etching method, and the like can be given. Note that the etching agent 142 is an etching gas in the case of a dry etching method and is a chemical solution in the case of a wet etching method. In this embodiment, a wet etching method is preferably employed for removing the first barrier film 131 because manufacturing cost can be saved in that case.

After that, the insulating film 118 functioning as a second barrier film is formed over the insulating film 116 (see FIG. 5A).

When a PECVD method is employed for forming the insulating film 118, the substrate temperature is lower than 400° C., preferably lower than 375° C., more preferably higher than or equal to 150° C. and lower than 360° C., and still more preferably higher than or equal to 350° C. and lower than 360° C.; in this case, the insulating film 118 can be dense. Note that the heat treatment at the second temperature after the first barrier film 131 is formed may be skipped when the substrate temperature during the formation of the insulating film 118 is in any of the above ranges.

For example, in the case where a silicon nitride film is formed by a PECVD method as the insulating film 118, a deposition gas containing silicon, nitrogen, and ammonia are preferably used as a source gas. The amount of ammonia is made smaller than that of nitrogen, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen are few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, the flow rate ratio of nitrogen to ammonia in the source gas is set to be greater than or equal to 5:1 and less than or equal to 50:1, preferably greater than or equal to 10:1 and less than or equal to 50:1.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the process chamber is 100 Pa, the substrate temperature is 350° C., and a high-frequency power of 1000 W is supplied to parallel-plate electrodes with a 27.12 MHz high-frequency power source. Note that the PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

Note that heat treatment may be performed after the insulating film 118 functioning as the second barrier film is formed. Through the heat treatment at the second temperature before the insulating film 118 is formed or the heat treatment after the insulating film 118 is formed, excess oxygen or oxygen radicals in the insulating film 116 can be diffused into the oxide semiconductor film 108 to fill oxygen vacancies in the oxide semiconductor film 108. Alternatively, the insulating film 118 may be formed while heat treatment is performed, whereby excess oxygen or oxygen radicals in the insulating film 116 can be diffused into the oxide semiconductor film 108 to fill oxygen vacancies in the oxide semiconductor film 108.

Through the above process, the transistor 100 illustrated in FIG. 5B can be manufactured.

<Method 2 for Manufacturing Semiconductor Device>

Next, a method for manufacturing the transistor 100, which is different from the manufacturing method described with reference to FIGS. 1A to 1C, FIGS. 2A to 2C, FIGS. 3A to 3C, FIGS. 4A to 4C, and FIG. 5A, will be described below.

First, like in <Method 1 for manufacturing semiconductor device>, the steps illustrated in FIGS. 1A to 1C, FIGS. 2A to 2C, and FIGS. 3A to 3C are performed. After that, the steps illustrated in FIGS. 4A to 4C and FIG. 5A are not performed. In other words, the structure illustrated in FIG.

3C has a function similar to that of the transistor 100 illustrated in FIGS. 5B and 5C.

In the case where the steps illustrated in FIGS. 4A to 4C and FIG. 5A are not performed, a metal oxide film is used as the first barrier film 131 in the structure illustrated in FIG. 3C; as the metal oxide film, aluminum oxide, hafnium oxide, or yttrium oxide is preferably deposited.

When aluminum oxide, hafnium oxide, or yttrium oxide is deposited as the first barrier film 131 by a sputtering method, a sputtering gas preferably contains at least oxygen. In some cases, oxygen for the sputtering gas for forming the first barrier film 131 becomes oxygen radicals in plasma, and the oxygen and/or the oxygen radicals can be added to the insulating film 116. In that case, the step of adding the oxygen 140 illustrated in FIG. 4A can be skipped. That is, the step of forming the first barrier film 131 can double as oxygen adding treatment. The first barrier film 131 has a function of adding oxygen during its formation (in particular, at the initial stage of deposition), whereas it has a function of blocking oxygen after its formation.

In the case where aluminum oxide is deposited as the first barrier film 131 by a sputtering method, a mixed layer is sometimes formed in the vicinity of the interface between the insulating film 116 and the first barrier film 131. When the insulating film 116 is a silicon oxynitride film, $Al_xSi_yO_z$ is formed as the mixed layer in some cases.

In the case where aluminum oxide, hafnium oxide, or yttrium oxide is used for the first barrier film 131, the step of removing the first barrier film 131 illustrated in FIG. 4C and the step of forming the insulating film 118 illustrated in FIG. 5A do not need to be performed because aluminum oxide, hafnium oxide, and yttrium oxide have a high insulating property and a high barrier property against oxygen. Therefore, the first barrier film 131 has the same function as the insulating film 118.

Note that the first barrier film 131 is formed while heat treatment is performed at a substrate temperature lower than 400° C. (that is, the second temperature), whereby excess oxygen or oxygen radicals added to the insulating film 116 can be diffused into the oxide semiconductor film 108. Alternatively, heat treatment is performed at the second temperature lower than 400° C. after the first barrier film 131 is formed, whereby excess oxygen or oxygen radicals added to the insulating film 116 can be diffused into the oxide semiconductor film 108.

The use of aluminum oxide, hafnium oxide, or yttrium oxide for the first barrier film 131 can shorten the manufacturing process of the semiconductor device and thus manufacturing cost can be saved.

<Method 3 for Manufacturing Semiconductor Device>

Figure 7A:
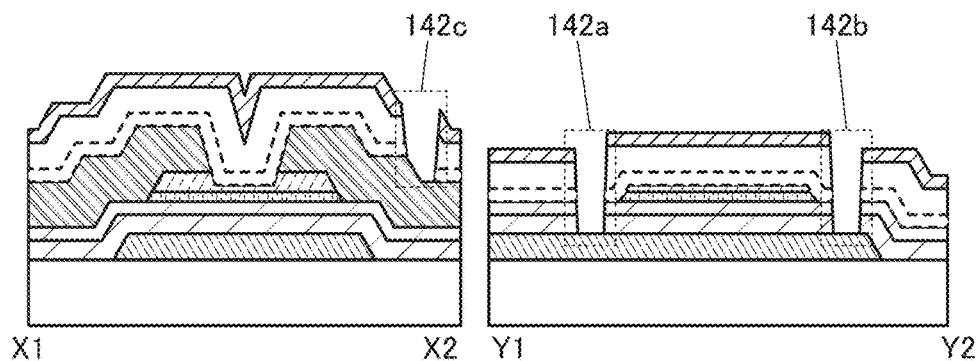
FIGS. 7A to 7C are cross-sectional views illustrating an example of a manufacturing process of a semiconductor device.
Figure 7B:
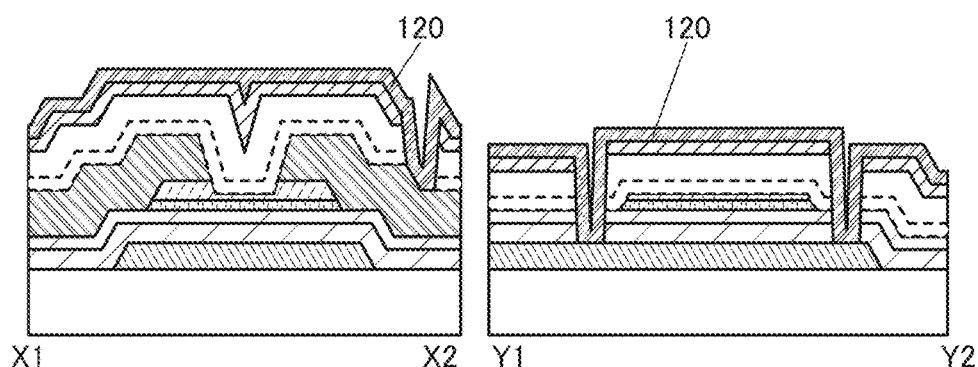
Figure 7C:
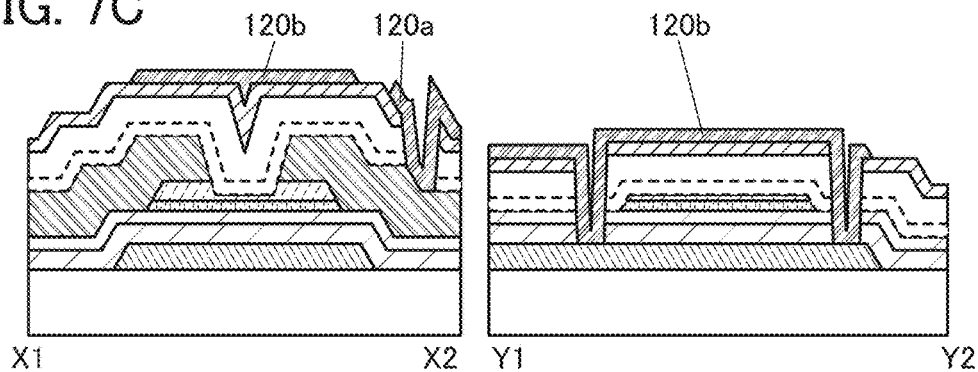

Next, a method for manufacturing the transistor 170 that is one embodiment of the present invention will be described with reference to FIGS. 7A to 7C. FIGS. 7A to 7C are cross-sectional views illustrating the method for manufacturing the semiconductor device. In each of FIGS. 7A to 7C, a cross-sectional view taken along the dashed-dotted line X1-X2 and a cross-sectional view taken along the dashed-dotted line Y1-Y2 are illustrated on the left side and the right side, respectively.

First, steps similar to those in the manufacturing method of the transistor 100 described above are performed (the steps illustrated in FIGS. 1A to 1C, FIGS. 2A to 2C, FIGS. 3A to 3C, FIGS. 4A to 4C, and FIG. 5A).

Next, a mask is formed over the insulating film 118 through a lithography process, and the opening 142c is formed in a desired region in the insulating films 114, 116, and 118. In addition, a mask is formed over the insulating film 118 through a lithography process, and the openings 142a and 142b are formed in desired regions in the insulating films 106, 107, 114, 116, and 118. Note that the opening 142c reaches the conductive film 112b. The openings 142a and 142b reach the conductive film 104 (see FIG. 7A).

Note that the openings 142a and 142b and the opening 142c may be formed in the same step or may be formed by different steps. In the case where the openings 142a and 142b and the opening 142c are formed in the same step, for example, a gray-tone mask or a half-tone mask can be used. Moreover, the openings 142a and 142b may be formed in some steps. For example, the insulating films 106 and 107 are processed and then the insulating films 114, 116, and 118 are processed.

Next, a conductive film 120 is formed over the insulating film 118 to cover the openings 142a, 142b, and 142c (see FIG. 7B).

For the conductive film 120, for example, a material containing one of indium (In), zinc (Zn), and tin (Sn) can be used. In particular, the conductive film 120 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin silicon oxide (ITSO). The conductive film 120 can be formed by a sputtering method, for example. In this embodiment, a 110-nm-thick ITSO film is formed by a sputtering method.

Next, a mask is formed over the conductive film 120 through a lithography process, and the conductive film 120 is processed into desired shapes to form the conductive films 120a and 120b (see FIG. 7C).

To form the conductive films 120a and 120b, for example, a dry etching method, a wet etching method, or a combination of a dry etching method and a wet etching method is used. In this embodiment, a wet etching method is employed for processing the conductive film 120 into the conductive films 120a and 120b.

Through the above process, the transistor 170 illustrated in FIGS. 6A and 6B can be manufactured.

The structures and methods described in this embodiment can be implemented by being combined as appropriate with any of the other structures and methods described in the other embodiments.

(Embodiment 2)

In this embodiment, the structure of an oxide semiconductor film included in a semiconductor device of one embodiment of the present invention will be described in detail.

<Structure of Oxide Semiconductor>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 10A:
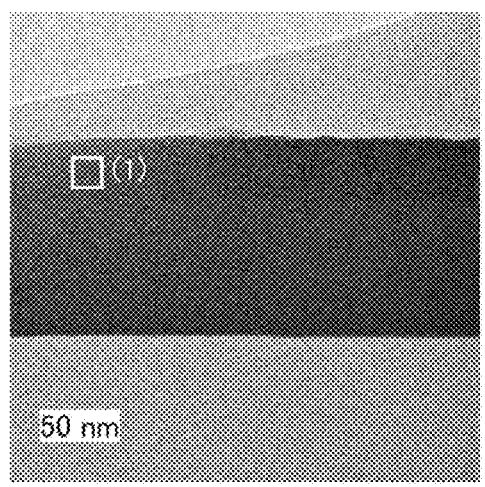
FIGS. 10A to 10D are Cs-corrected high-resolution TEM images of a cross section of a CAAC-OS and a cross-sectional schematic view of a CAAC-OS.

A CAAC-OS observed with TEM is described below. FIG. 10A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 10B:
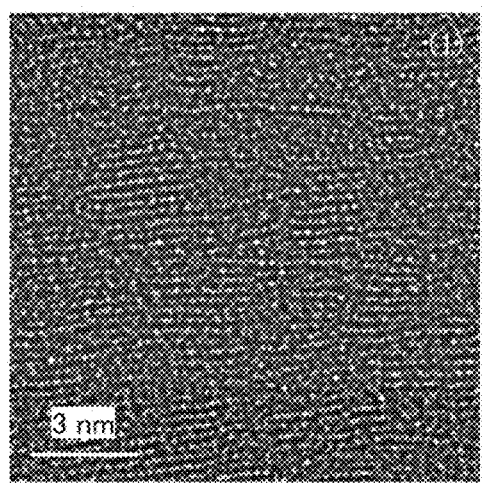

FIG. 10B is an enlarged Cs-corrected high-resolution TEM image of a region (1) in FIG. 10A. FIG. 10B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 10C:
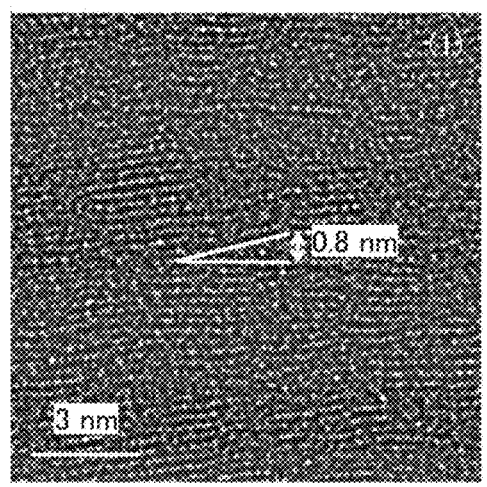

As shown in FIG. 10B, the CAAC-OS has a characteristic atomic arrangement. The characteristic atomic arrangement is denoted by an auxiliary line in FIG. 10C. FIGS. 10B and 10C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Note that a CAAC-OS can be referred to as an oxide semiconductor including c-axis aligned nanocrystals (CANC).

Figure 10D:
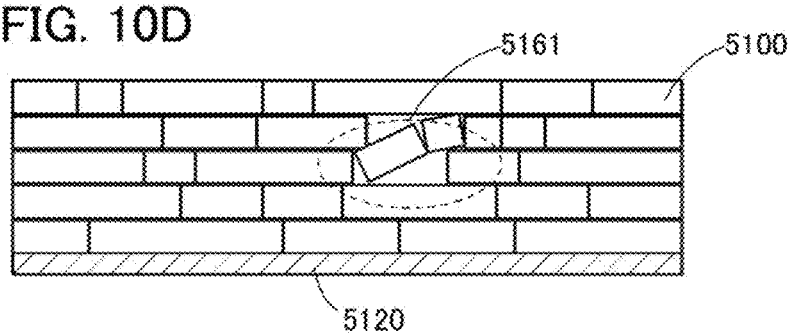

Here, according to the Cs-corrected high-resolution TEM images, the schematic arrangement of pellets 5100 of a CAAC-OS over a substrate 5120 is illustrated by such a structure in which bricks or blocks are stacked (see FIG. 10D). The part in which the pellets are tilted as observed in FIG. 10C corresponds to a region 5161 shown in FIG. 10D.

FIG. 11A shows a Cs-corrected high-resolution TEM image of a plane of the CAAC-OS observed from a direction substantially perpendicular to the sample surface. FIGS. 11B, 11C, and 11D are enlarged Cs-corrected high-resolution TEM images of regions (1), (2), and (3) in FIG. 11A, respectively. FIGS. 11B, 11C, and 11D indicate that metal atoms are arranged in a triangular, quadrangular, or hexagonal configuration in a pellet. However, there is no regularity of arrangement of metal atoms between different pellets.

Figure 12A:
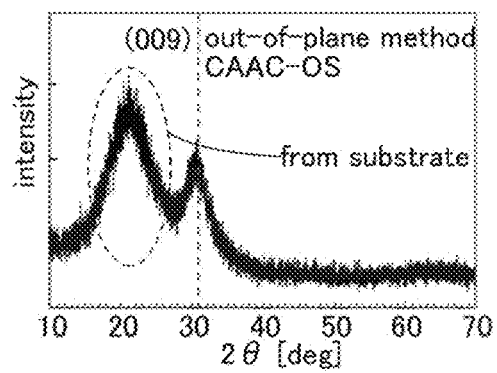
FIGS. 12A to 12C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 12A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 12B:
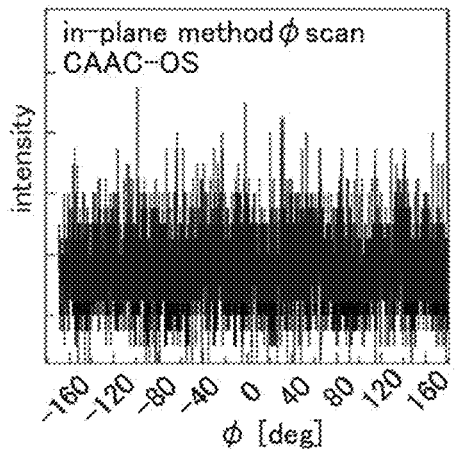
Figure 12C:
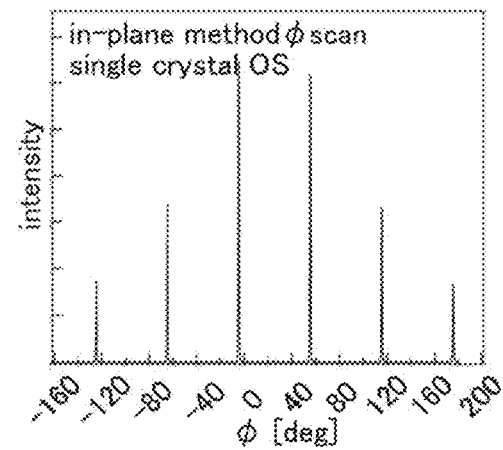

On the other hand, in structural analysis of the CAAC-OS by an in-plane method in which an X-ray is incident on a sample in a direction substantially perpendicular to the c-axis, a peak appears when $2\theta$ is around 56°. This peak is attributed to the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 12B, a peak is not clearly observed. In contrast, in the case of a single crystal oxide semiconductor of $InGaZnO_4$, when $\phi$ scan is performed with $2\theta$ fixed at around 56°, as shown in FIG. 12C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 13A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 13B shows a diffraction pattern obtained in such a manner that an electron beam with a probe diameter of 300 nm is incident on the same sample in a direction perpendicular to the sample surface. As shown in FIG. 13B, a ring-like diffraction pattern is observed. Thus, the electron diffraction also indicates that the a-axes and b-axes of the pellets included in the CAAC-OS do not have regular alignment. The first ring in FIG. 13B is considered to be derived from the (010) plane, the (100) plane, and the like of the $InGaZnO_4$ crystal. The second ring in FIG. 13B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 14:
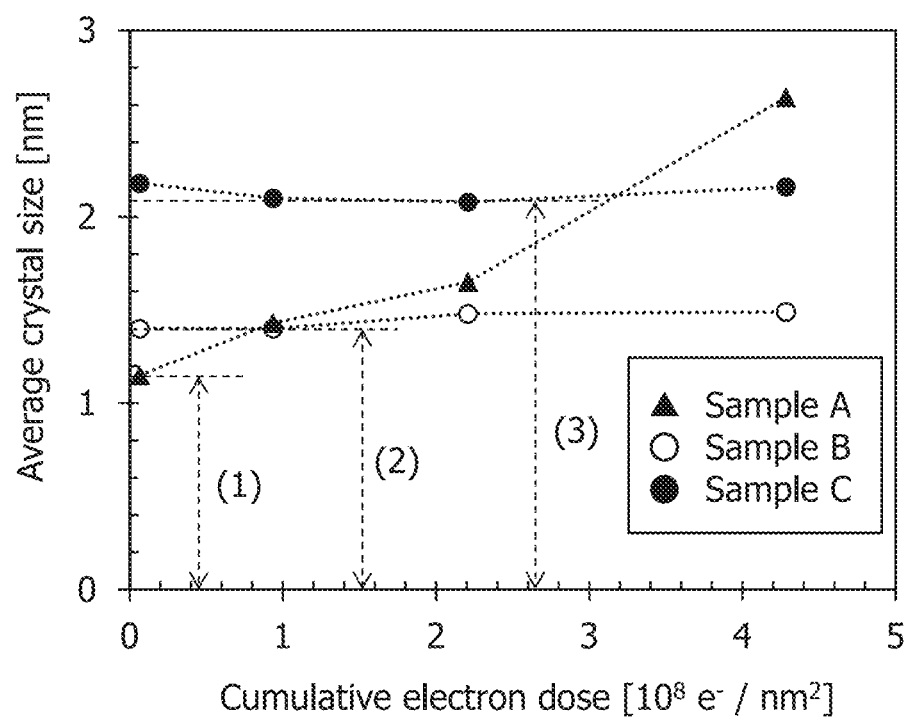
FIG. 14 shows changes in crystal parts of In—Ga—Zn oxides induced by electron irradiation.

FIG. 14 shows change in the average size of crystal parts (at 22 points to 45 points) in each sample. Note that the crystal part size corresponds to the length of a lattice fringe. FIG. 14 indicates that the crystal part size in the a-like OS increases with an increase in the cumulative electron dose. Specifically, as shown by (1) in FIG. 14, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 14, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a desired composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Deposition Model>

Examples of deposition models of a CAAC-OS and an nc-OS are described below.

Figure 15A:
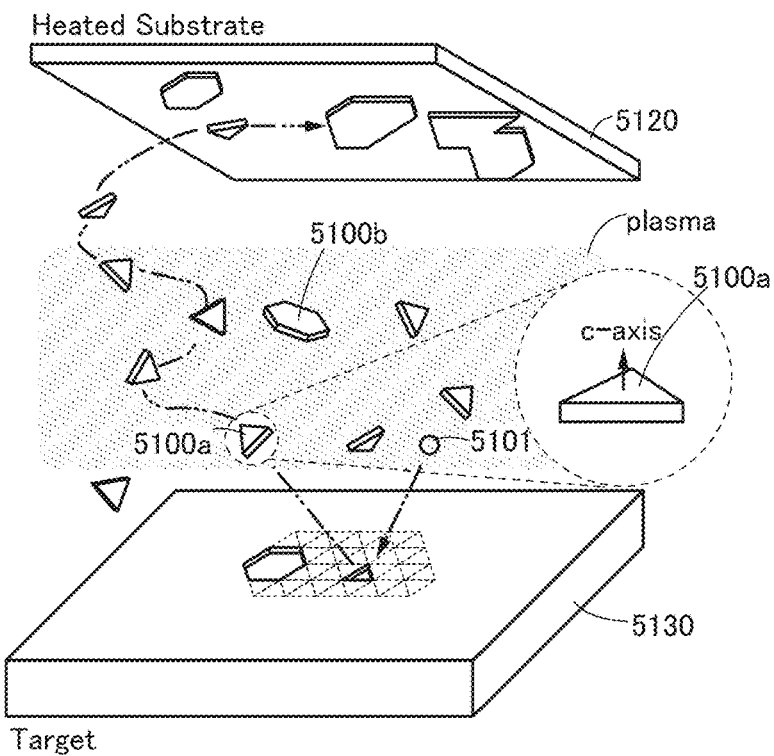
FIGS. 15A and 15B are schematic views showing deposition models of a CAAC-OS and an nc-OS.

FIG. 15A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generate a magnetic field. The above description of the deposition chamber is referred to for the layout and structure of magnets. A sputtering method in which the deposition rate is increased by utilizing a magnetic field of magnets is referred to as a magnetron sputtering method.

The target 5130 has a polycrystalline structure in which a cleavage plane exists in at least one crystal grain.

Figure 16A:
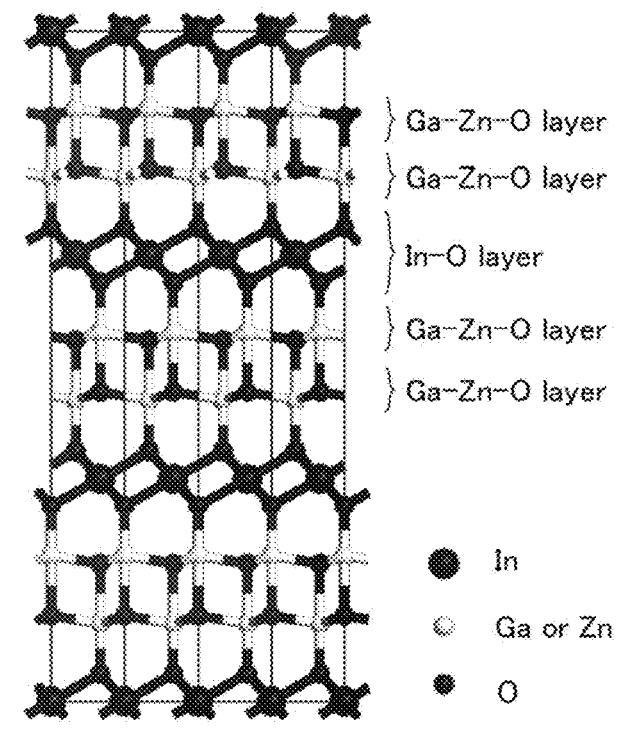
FIGS. 16A to 16C show an InGaZnO$_4$ crystal and a pellet.

A cleavage plane of the target 5130 including an In—Ga—Zn oxide is described as an example. FIG. 16A shows a structure of an $InGaZnO_4$ crystal included in the target 5130.

Note that FIG. 16A shows a structure of the case where the $InGaZnO_4$ crystal is observed from a direction parallel to the b-axis when the c-axis is in an upward direction.

FIG. 16A indicates that oxygen atoms in a Ga—Zn—O layer are positioned close to those in an adjacent Ga—Zn—O layer. The oxygen atoms have negative electric charge, whereby the two Ga—Zn—O layers repel each other. As a result, the $InGaZnO_4$ crystal has a cleavage plane between the two adjacent Ga—Zn—O layers.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation ($O^+$) and an argon cation ($Ar^+$).

The ion 5101 is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 16B:
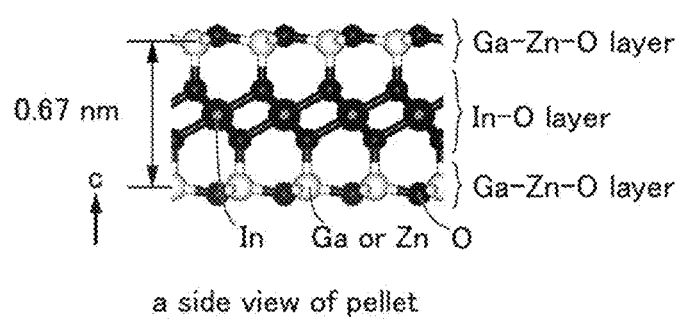

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm. The pellet 5100 corresponds to the initial nucleus in the description of (1) in FIG. 14. For example, in the case where the ion 5101 collides with the target 5130 including an In—Ga—Zn oxide, the pellet 5100 that includes three layers of a Ga—Zn—O layer, an In—O layer, and a Ga—Zn—O layer as shown in FIG. 16B is ejected.

Figure 16C:
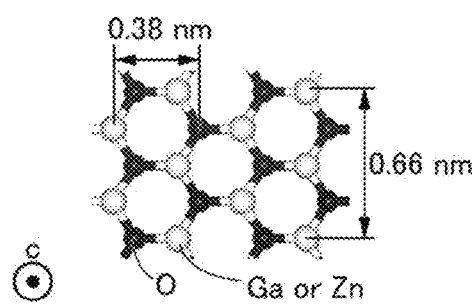

Note that FIG. 16C shows the structure of the pellet 5100 observed from a direction parallel to the c-axis. Therefore, the pellet 5100 has a nanometer-sized sandwich structure including two Ga—Zn—O layers (pieces of bread) and an In—O layer (filling).

The pellet 5100 receives a charge when passing through the plasma, so that side surfaces thereof are negatively or positively charged in some cases. The pellet 5100 includes an oxygen atom on its side surface, and the oxygen atom may be negatively charged. In this manner, when the side surfaces are charged with the same polarity, charges repel each other, and accordingly, the pellet 5100 can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded to an indium atom, a gallium atom, a zinc atom, an oxygen atom, or the like when passing through plasma. This is a cause of a difference in size between (2) and (1) in FIG. 14. Here, in the case where the temperature of the substrate 5120 is at around room temperature, the pellet 5100 does not grow anymore; thus, an nc-OS is formed (see FIG. 15B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 15B:
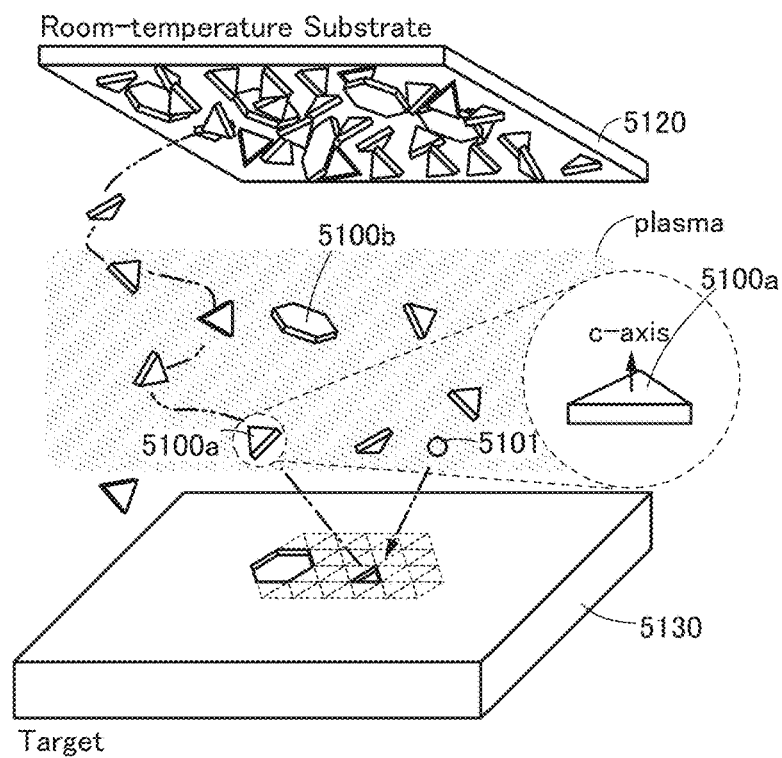

As shown in FIGS. 15A and 15B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to increase a force applied to the pellet 5100, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, magnet units and/or the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 15A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where the flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS is filled in some cases; thus, the CAAC-OS has a low density of defect states. Note that the temperature of the top surface of the substrate 5120 is, for example, higher than or equal to 100° C. and lower than 500° C., higher than or equal to 150° C. and lower than 450° C., higher than or equal to 170° C. and lower than 400° C., or higher than or equal to 170° C. and lower than or equal to 350° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist therebetween. Therefore, even when deformation such as shrink occurs in the CAAC-OS owing to heating during deposition or heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target is sputtered with an ion, in addition to the pellets, zinc oxide or the like may be ejected. The zinc oxide is lighter than the pellet and thus reaches the top surface of the substrate 5120 before the pellet. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 17A to 17D are cross-sectional schematic views.

Figure 17A:
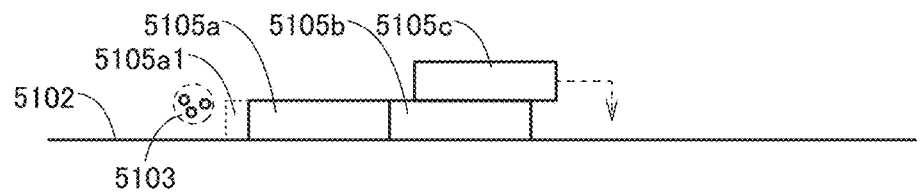
FIGS. 17A to 17D are schematic views showing a deposition model of a CAAC-OS.

As illustrated in FIG. 17A, a pellet 5105*a* and a pellet 5105*b* are deposited over the zinc oxide layer 5102. Here, side surfaces of the pellet 5105*a* and the pellet 5105*b* are in contact with each other. In addition, a pellet 5105*c* is deposited over the pellet 5105*b*, and then glides over the pellet 5105*b*. Furthermore, a plurality of particles 5103 ejected from the target together with the zinc oxide are crystallized by heating of the substrate 5120 to form a region 5105*a*1 on another side surface of the pellet 5105*a*. Note that the plurality of particles 5103 may contain oxygen, zinc, indium, gallium, or the like.

Figure 17B:
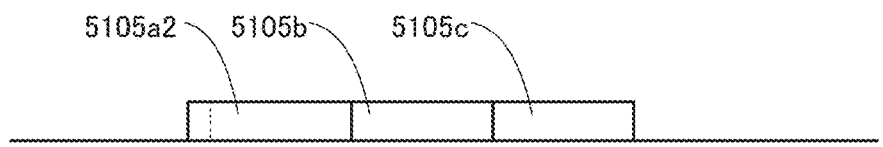

Then, as illustrated in FIG. 17B, the region 5105*a*1 grows to part of the pellet 5105*a* to form a pellet 5105*a*2. In addition, a side surface of the pellet 5105*c* is in contact with another side surface of the pellet 5105*b*.

Figure 17C:
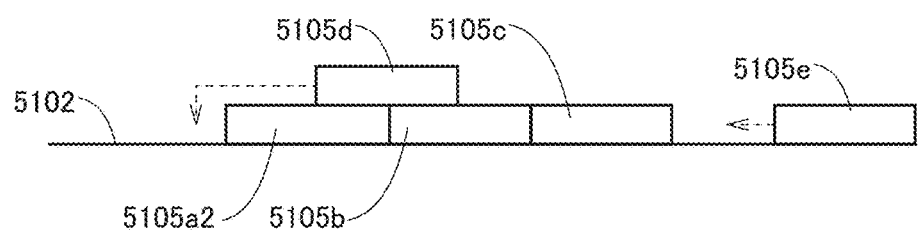

Next, as illustrated in FIG. 17C, a pellet 5105*d* is deposited over the pellet 5105*a*2 and the pellet 5105*b*, and then glides over the pellet 5105*a*2 and the pellet 5105*b*. Furthermore, a pellet 5105*e* glides toward another side surface of the pellet 5105*c* over the zinc oxide layer 5102.

Figure 17D:
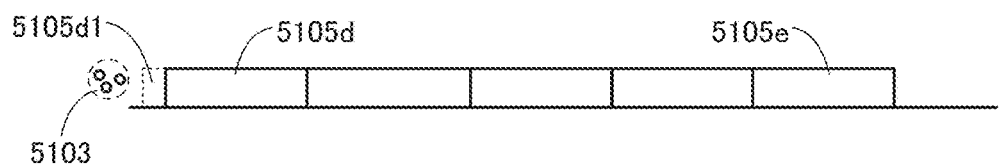

Then, as illustrated in FIG. 17D, the pellet 5105*d* is placed so that a side surface of the pellet 5105*d* is in contact with a side surface of the pellet 5105a2. Furthermore, a side surface of the pellet 5105e is in contact with another side surface of the pellet 5105c. A plurality of particles 5103 ejected from the target together with the zinc oxide are crystallized by heating of the substrate 5120 to form a region 5105d1 on another side surface of the pellet 5105d.

As described above, deposited pellets are placed to be in contact with each other and then crystal growth is caused at side surfaces of the pellets, whereby a CAAC-OS is formed over the substrate 5120. Therefore, each pellet of the CAAC-OS is larger than that of the nc-OS. This is a cause of a difference in size between (3) and (2) in FIG. 14.

When spaces between the pellets 5100 are extremely small, the pellets may form a large pellet. The large pellet has a single crystal structure. For example, the size of the large pellet may be greater than or equal to 10 nm and less than or equal to 200 nm, greater than or equal to 15 nm and less than or equal to 100 nm, or greater than or equal to 20 nm and less than or equal to 50 nm, when seen from the above. Therefore, when a channel formation region of a transistor is smaller than the large pellet, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure, which is different from film deposition by epitaxial growth. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards; thus, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the convex surface are stacked is formed. Since the substrate 5120 has unevenness, a gap is easily generated between the pellets 5100 in the CAAC-OS in some cases. Note that owing to intermolecular force, the pellets 5100 are arranged so that a gap between the pellets is as small as possible even on the unevenness surface. Therefore, even when the formation surface has unevenness, a CAAC-OS with high crystallinity can be obtained.

As a result, laser crystallization is not needed for formation of a CAAC-OS, and a uniform film can be formed even over a large-sized glass substrate or the like.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

The structures described in this embodiment can be used in appropriate combination with any of the structures described in the other embodiments.

(Embodiment 3)

In this embodiment, an example of a display device that includes any of the transistors described in the above embodiment will be described below with reference to FIG. 18, FIG. 19, and FIG. 20.

Figure 18:
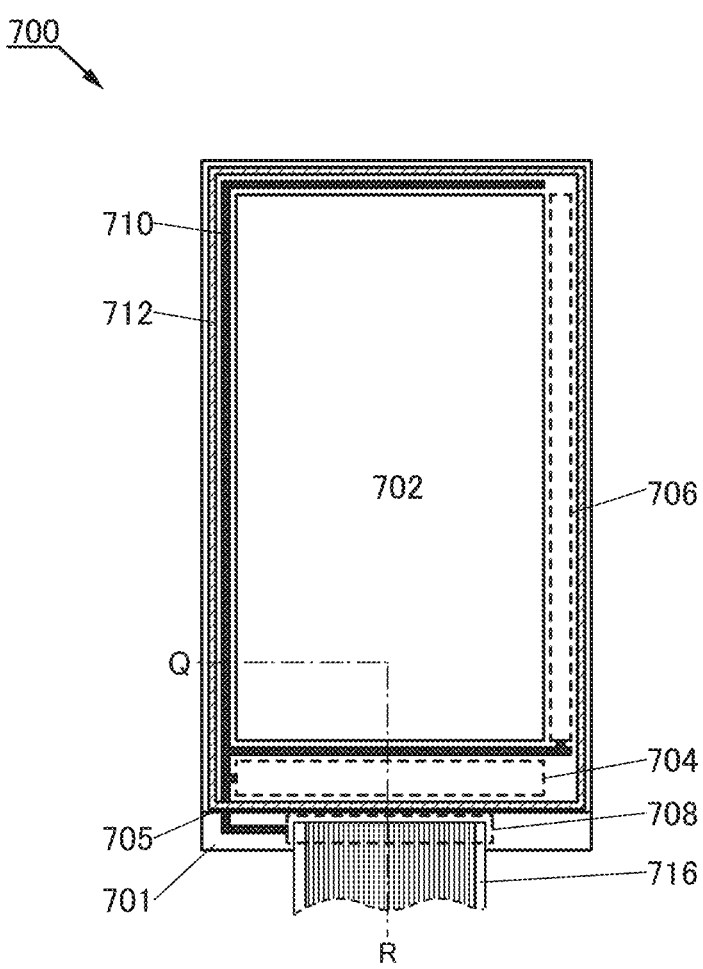
FIG. 18 is a top view illustrating one embodiment of a display device.

FIG. 18 is a top view of an example of a display device. A display device 700 illustrated in FIG. 18 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 18, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. Various signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver circuit substrate formed using a single crystal semiconductor film or a polycrystalline semiconductor film) may be mounted on the first substrate 701. There is no particular limitation on the connection method of a separately formed driver circuit substrate; a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used.

The display device 700 can include any of a variety of elements. The element includes, for example, at least one of a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. In addition, a display medium whose contrast, luminance, reflectance, transmittance, or the like is changed by electric action or magnetic action may be included. Note that examples of display devices including EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Note that the sizes of display regions may be different between respective dots of color elements. Embodiments of the disclosed invention are not limited to a display device for color display; the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

In this embodiment, structures including a liquid crystal element and an EL element as display elements will be described with reference to FIG. 19 and FIG. 20. Note that FIG. 19 is a cross-sectional view taken along the dashed-dotted line Q-R shown in FIG. 18 and shows a structure including a liquid crystal element as a display element, whereas FIG. 20 is a cross-sectional view taken along the dashed-dotted line Q-R shown in FIG. 18 and shows a structure including an EL element as a display element.

Figure 19:
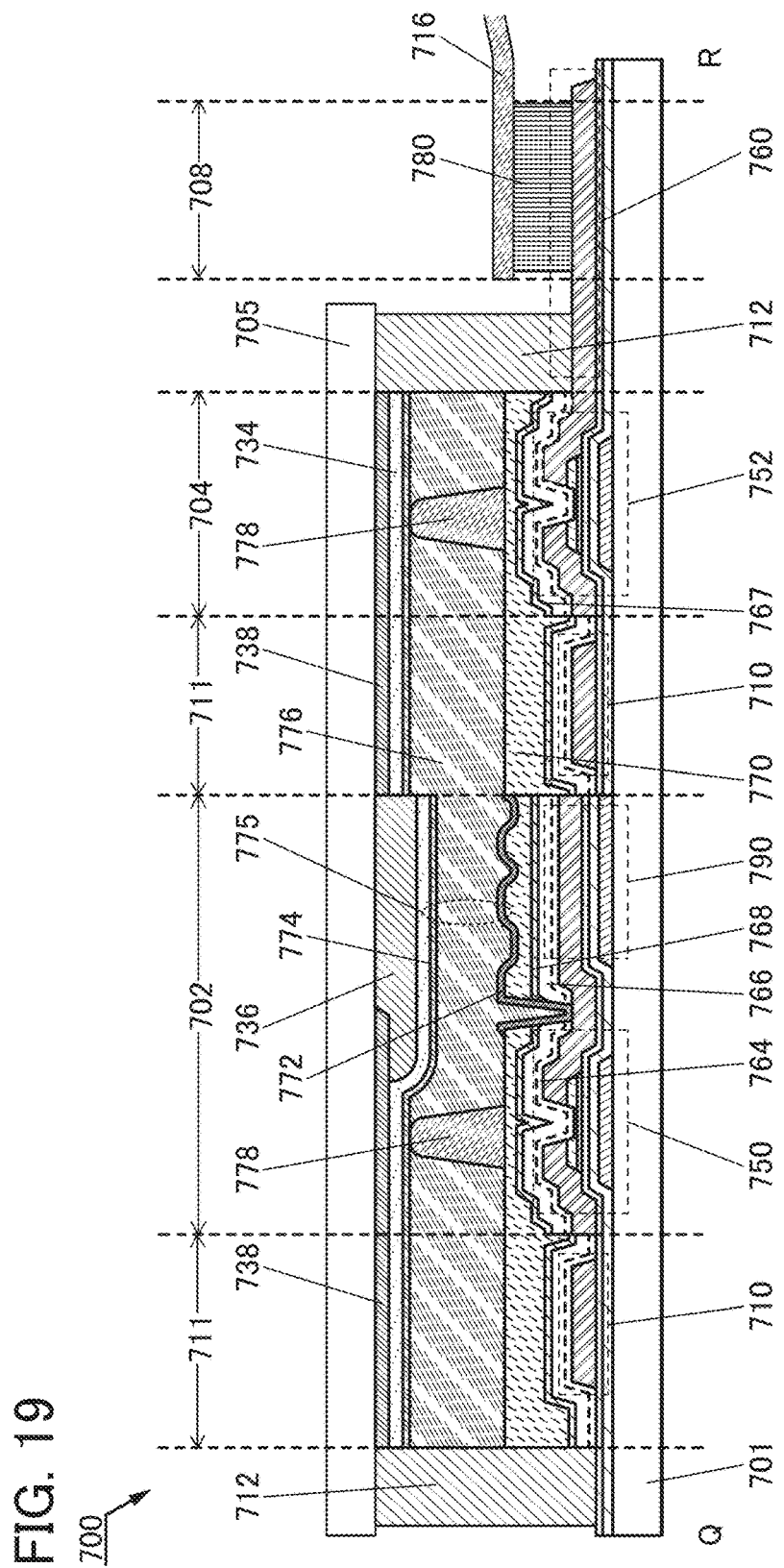
FIG. 19 is a cross-sectional view illustrating one embodiment of a display device.
Figure 20:
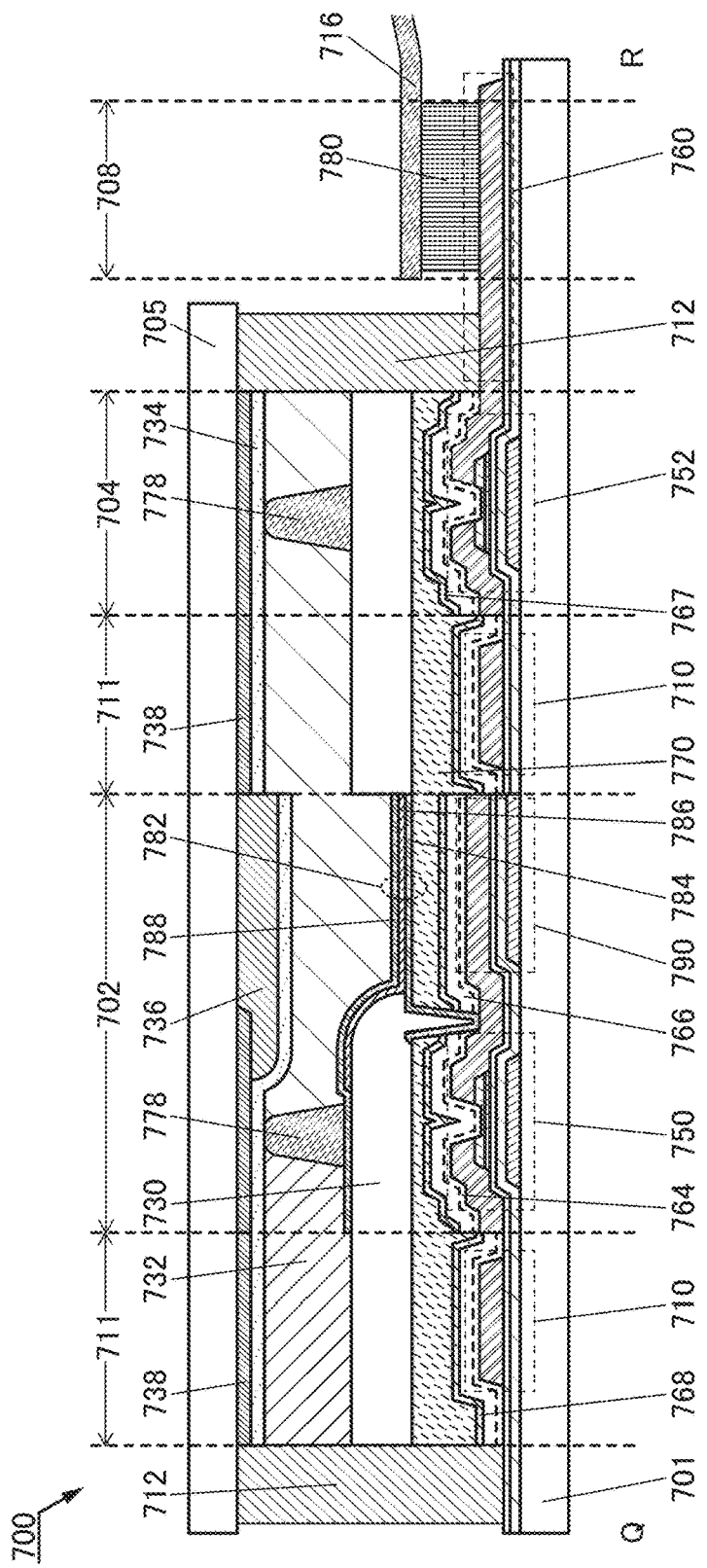
FIG. 20 is a cross-sectional view illustrating one embodiment of a display device.

Common portions between FIG. 19 and FIG. 20 are described first, and then different portions are described.

<Common Portions in Display Devices>

The display device 700 illustrated in each of FIG. 19 and FIG. 20 includes a lead wiring portion 711, the pixel portion 702, the source driver circuit portion 704, and the FPC terminal portion 708. Note that the lead wiring portion 711 includes the signal line 710. The pixel portion 702 includes a transistor 750 and a capacitor 790. The source driver circuit portion 704 includes a transistor 752.

Any of the transistors described above can be used as the transistors 750 and 752.

The transistors used in this embodiment each include an oxide semiconductor film which is highly purified and in which formation of oxygen vacancy is suppressed. In the transistors, the current in an off state (off-state current) can be made small. Accordingly, an electrical signal such as an image signal can be held for a longer period, and a writing interval can be set longer in an on state. Accordingly, the frequency of refresh operation can be reduced, which leads to an effect of reducing power consumption.

In addition, the transistors used in this embodiment can have relatively high field-effect mobility and thus are capable of high-speed operation. For example, with such a transistor that can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor that can operate at high speed can be used also in the pixel portion, whereby a high-quality image can be provided.

The capacitor 790 has a structure in which a dielectric is provided between a pair of electrodes. Specifically, a conductive film which is formed through the same process as a conductive film functioning as the gate electrode of the transistor 750 is used as one electrode of the capacitor 790, and the conductive film functioning as a source electrode or a drain electrode of the transistor 750 is used as the other electrode of the capacitor 790. Furthermore, an insulating film functioning as a gate insulating film of the transistor 750 is used as the dielectric between the pair of electrodes.

In FIG. 19 and FIG. 20, insulating films 764, 766, and 768, an oxide semiconductor film 767, and a planarization insulating film 770 are formed over the transistor 750, the transistor 752, and the capacitor 790.

The insulating films 764, 766, and 768 can be formed using materials and methods similar to those of the insulating films 114, 116, and 118 described in the above embodiment, respectively. The oxide semiconductor film 767 can be formed using a material and a method similar to those of the oxide semiconductor film 108 described in the above embodiment. The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed using these materials. Alternatively, a structure without the planarization insulating film 770 may be employed.

The signal line 710 is formed through the same process as conductive films functioning as the source electrode and the drain electrode of the transistor 750 or 752. Note that the signal line 710 may be formed using a conductive film which is formed through a different process from the source electrode and the drain electrode of the transistor 750 or 752, e.g., a conductive film functioning as a gate electrode. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as the source electrode and the drain electrode of the transistor 750 or 752. The connection electrode 760 is electrically connected to a terminal included in the FPC 716 through the anisotropic conductive film 780.

For example, a glass substrate can be used as the first substrate 701 and the second substrate 705. As the first substrate 701 and the second substrate 705, a flexible substrate may be used. Examples of the flexible substrate include a plastic substrate.

A structure 778 is provided between the first substrate 701 and the second substrate 705. The structure 778 is a columnar spacer obtained by selective etching of an insulating film and is provided to control the thickness (cell gap) between the first substrate 701 and the second substrate 705. Note that a spherical spacer may be used as the structure 778. Although the example in which the structure 778 is provided on the first substrate 701 side is described in this embodiment, one embodiment of the present invention is not limited thereto. For example, the structure 778 may be provided on the second substrate 705 side, or both the first substrate 701 and the second substrate 705 may be provided with the structure 778.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

<Structure Example of Display Device Using Liquid Crystal Element as Display Element>

The display device 700 illustrated in FIG. 19 includes a liquid crystal element 775. The liquid crystal element 775 includes the conductive film 772, a conductive film 774, and a liquid crystal layer 776. The conductive film 774 is provided on the second substrate 705 side and functions as a counter electrode. The display device 700 in FIG. 19 is capable of displaying an image in such a manner that light transmission or non-transmission is controlled by change in the alignment state of the liquid crystal layer 776 depending on a voltage applied between the conductive film 772 and the conductive film 774.

The conductive film 772 is connected to the conductive film functioning as the source electrode or the drain electrode included in the transistor 750. The conductive film 772 is formed over the planarization insulating film 770 to function as a pixel electrode, i.e., one electrode of the display element. The conductive film 772 functions as a reflective electrode. The display device 700 in FIG. 19 is what is called a reflective color liquid crystal display device in which external light is reflected by the conductive film 772 to display an image through the coloring film 736.

A conductive film that transmits visible light or a conductive film that reflects visible light can be used as the conductive film 772. For example, a material including one kind selected from indium (In), zinc (Zn), and tin (Sn) is preferably used for the conductive film that transmits visible light. For example, a material including aluminum or silver may be used for the conductive film that reflects visible light. In this embodiment, a conductive film that reflects visible light is used as the conductive film 772.

In the case where a conductive film which reflects visible light is used as the conductive film 772, the conductive film may have a stacked-layer structure. For example, a 100-nm-thick aluminum film is formed as the bottom layer, and a 30-nm-thick silver alloy film (e.g., an alloy film including silver, palladium, and copper) is formed as the top layer. Such a structure makes it possible to obtain the following effects.

(1) Adhesion between the base film and the conductive film 772 can be improved. (2) The aluminum film and the silver alloy film can be collectively etched depending on a chemical solution. (3) The conductive film 772 can have a favorable cross-sectional shape (e.g., a tapered shape). The reason for (3) is as follows: the etching rate of the aluminum film with the chemical solution is lower than that of the silver alloy film, or etching of the aluminum film that is the bottom layer is developed faster than that of the silver alloy film because when the aluminum film that is the bottom layer is exposed after the etching of the silver alloy film that is the top layer, electrons are extracted from metal that is less noble than the silver alloy film, i.e., aluminum that is metal having a high ionization tendency, and thus etching of the silver alloy film is suppressed.

Note that projections and depressions are provided in part of the planarization insulating film 770 of the pixel portion 702 in the display device 700 in FIG. 19. The projections and depressions can be formed in such a manner that the planarization insulating film 770 is formed using an organic resin film or the like, and projections and depressions are formed on the surface of the organic resin film. The conductive film 772 functioning as a reflective electrode is formed along the projections and depressions. Therefore, when external light is incident on the conductive film 772, the light is reflected diffusely at the surface of the conductive film 772, whereby visibility can be improved.

Note that the display device 700 illustrated in FIG. 19 is a reflective color liquid crystal display device given as an example, but a display type is not limited thereto. For example, a transmissive color liquid crystal display device in which the conductive film 772 is a conductive film that transmits visible light may be used. In the case of a transmissive color liquid crystal display device, projections and depressions are not necessarily provided on the planarization insulating film 770.

Although not illustrated in FIG. 19, an alignment film may be provided on each of the conductive film 772 and the conductive film 774 on the side in contact with the liquid crystal layer 776. Although not illustrated in FIG. 19, an optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a side light, or the like may be used as a light source.

In the case where a liquid crystal element is used as the display element, thermotropic liquid crystal, low-molecular liquid crystal, high-molecular liquid crystal, polymer dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

In the case of employing a horizontal electric field mode, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and has optical isotropy. In addition, the liquid crystal composition which includes liquid crystal exhibiting a blue phase and a chiral material does not need alignment treatment and has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Further, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

<Display Device Using Light-Emitting Element as Display Element>

The display device 700 illustrated in FIG. 20 includes a light-emitting element 782. The light-emitting element 782 includes a conductive film 784, an EL layer 786, and a conductive film 788. The display device 700 illustrated in FIG. 20 is capable of displaying an image by light emission from the EL layer 786 included in the light-emitting element 782.

The conductive film 784 is connected to the conductive film functioning as the source electrode or the drain electrode included in the transistor 750. The conductive film 784 is formed over the planarization insulating film 770 to function as a pixel electrode, i.e., one electrode of the display element. A conductive film which transmits visible light or a conductive film which reflects visible light can be used for the conductive film 784. For example, a material including one kind selected from indium (In), zinc (Zn), and tin (Sn) is preferably used for the conductive film that transmits visible light. For example, a material including aluminum or silver is preferably used for the conductive film that reflects visible light.

In the display device 700 illustrated in FIG. 20, an insulating film 730 is provided over the planarization insulating film 770 and the conductive film 784. The insulating film 730 covers part of the conductive film 784. Note that the light-emitting element 782 has a top-emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 784 side, or a dual-emission structure in which light is emitted to both the conductive film 784 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Although the coloring film 736 is provided in the example of the display device 700 illustrated in FIG. 20, one embodiment of the present invention is not limited thereto. In the case where the EL layer 786 is formed by a separate coloring method, the coloring film 736 is not necessarily provided.

The structures described in this embodiment can be used in appropriate combination with any of the structures described in the other embodiments.

(Embodiment 4)

In this embodiment, a display device that includes a semiconductor device of one embodiment of the present invention will be described with reference to FIGS. 21A to 21C.

The display device illustrated in FIG. 21A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

A part or the whole of the driver circuit portion 504 is preferably formed over a substrate over which the pixel portion 502 is formed, in which case the number of components and the number of terminals can be reduced. When a part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504*a*) and a circuit for supplying a signal (data signal) to drive a display element in a pixel (hereinafter, the circuit is referred to as a source driver 504*b*).

The gate driver 504*a* includes a shift register or the like. The gate driver 504*a* receives a signal for driving the shift register through the terminal portion 507 and outputs a signal. For example, the gate driver 504*a* receives a start pulse signal, a clock signal, or the like and outputs a pulse signal. The gate driver 504*a* has a function of controlling the potentials of wirings supplied with scan signals (hereinafter, such wirings are referred to as scan lines GL_1 to GL_X). Note that a plurality of gate drivers 504*a* may be provided to control the scan lines GL_1 to GL_X separately. Alternatively, the gate driver 504*a* has a function of supplying an initialization signal. Without being limited thereto, the gate driver 504*a* can supply another signal.

The source driver 504*b* includes a shift register or the like. The source driver 504*b* receives a signal (image signal) from which a data signal is derived, as well as a signal for driving the shift register, through the terminal portion 507. The source driver 504*b* has a function of generating a data signal to be written to the pixel circuit 501 which is based on the image signal. In addition, the source driver 504*b* has a function of controlling output of a data signal in response to a pulse signal produced by input of a start pulse signal, a clock signal, or the like. Furthermore, the source driver 504*b* has a function of controlling the potentials of wirings supplied with data signals (hereinafter such wirings are referred to as data lines DL_1 to DL_Y). Alternatively, the source driver 504*b* has a function of supplying an initialization signal. Without being limited thereto, the source driver 504*b* can supply another signal.

The source driver 504*b* includes a plurality of analog switches or the like, for example. The source driver 504*b* can output, as the data signals, signals obtained by time-dividing the image signal by sequentially turning on the plurality of analog switches. The source driver 504*b* may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504*a*. For example, to the pixel circuit 501 in the m-th row and the n-th column (m is a natural number of less than or equal to X, and n is a natural number of less than or equal to Y), a pulse signal is input from the gate driver 504*a* through the scan line GL_m, and a data signal is input from the source driver 504*b* through the data line DL_n in accordance with the potential of the scan line GL_m.

Figure 21A:
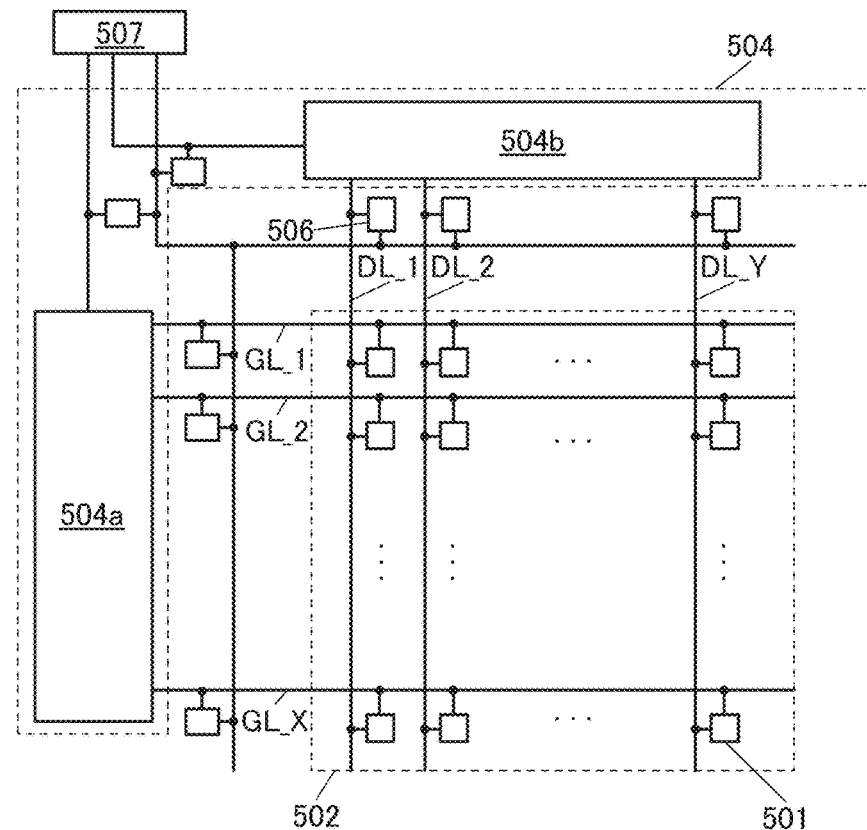
FIGS. 21A to 21C are a block diagram and circuit diagrams illustrating a display device.

The protection circuit 506 shown in FIG. 21A is connected to, for example, the scan line GL between the gate driver 504*a* and the pixel circuit 501. Alternatively, the protection circuit 506 is connected to the data line DL between the source driver 504*b* and the pixel circuit 501. Alternatively, the protection circuit 506 can be connected to a wiring between the gate driver 504*a* and the terminal portion 507. Alternatively, the protection circuit 506 can be connected to a wiring between the source driver 504*b* and the terminal portion 507. Note that the terminal portion 507 means a portion having terminals for inputting power, control signals, and image signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 21A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504*a* or the protection circuit 506 may be configured to be connected to the source driver 504*b*. Alternatively, the protection circuit 506 may be configured to be connected to the terminal portion 507.

In FIG. 21A, an example in which the driver circuit portion 504 includes the gate driver 504*a* and the source driver 504*b* is shown; however, the structure is not limited thereto. For example, only the gate driver 504*a* may be formed and a separately prepared substrate where a source driver circuit is formed (e.g., a driver circuit substrate formed with a single crystal semiconductor film or a polycrystalline semiconductor film) may be mounted.

Figure 21B:
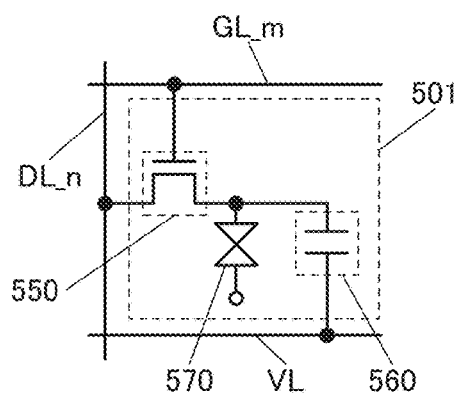

Each of the plurality of pixel circuits 501 in FIG. 21A can have the structure illustrated in FIG. 21B, for example.

The pixel circuit 501 illustrated in FIG. 21B includes a liquid crystal element 570, a transistor 550, and a capacitor 560. As the transistor 550, any of the transistors described in the above embodiment, for example, can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 21B, the pixel circuits 501 are sequentially selected row by row by the gate driver 504a illustrated in FIG. 21A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 21C:
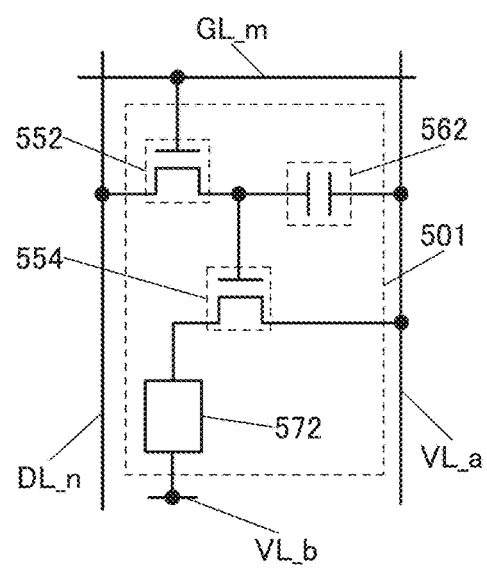

Alternatively, each of the plurality of pixel circuits 501 in FIG. 21A can have the structure illustrated in FIG. 21C, for example.

The pixel circuit 501 illustrated in FIG. 21C includes transistors 552 and 554, a capacitor 562, and a light-emitting element 572. Any of the transistors described in the above embodiment can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 21C, the pixel circuits 501 are sequentially selected row by row by the gate driver 504a illustrated in FIG. 21A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image is displayed.

The structures described in this embodiment can be used in appropriate combination with any of the structures described in the other embodiments.

(Embodiment 5)

In this embodiment, a display module and electronic devices that include a semiconductor device of one embodiment of the present invention will be described with reference to FIG. 22 and FIGS. 23A to 23G.

Figure 22:
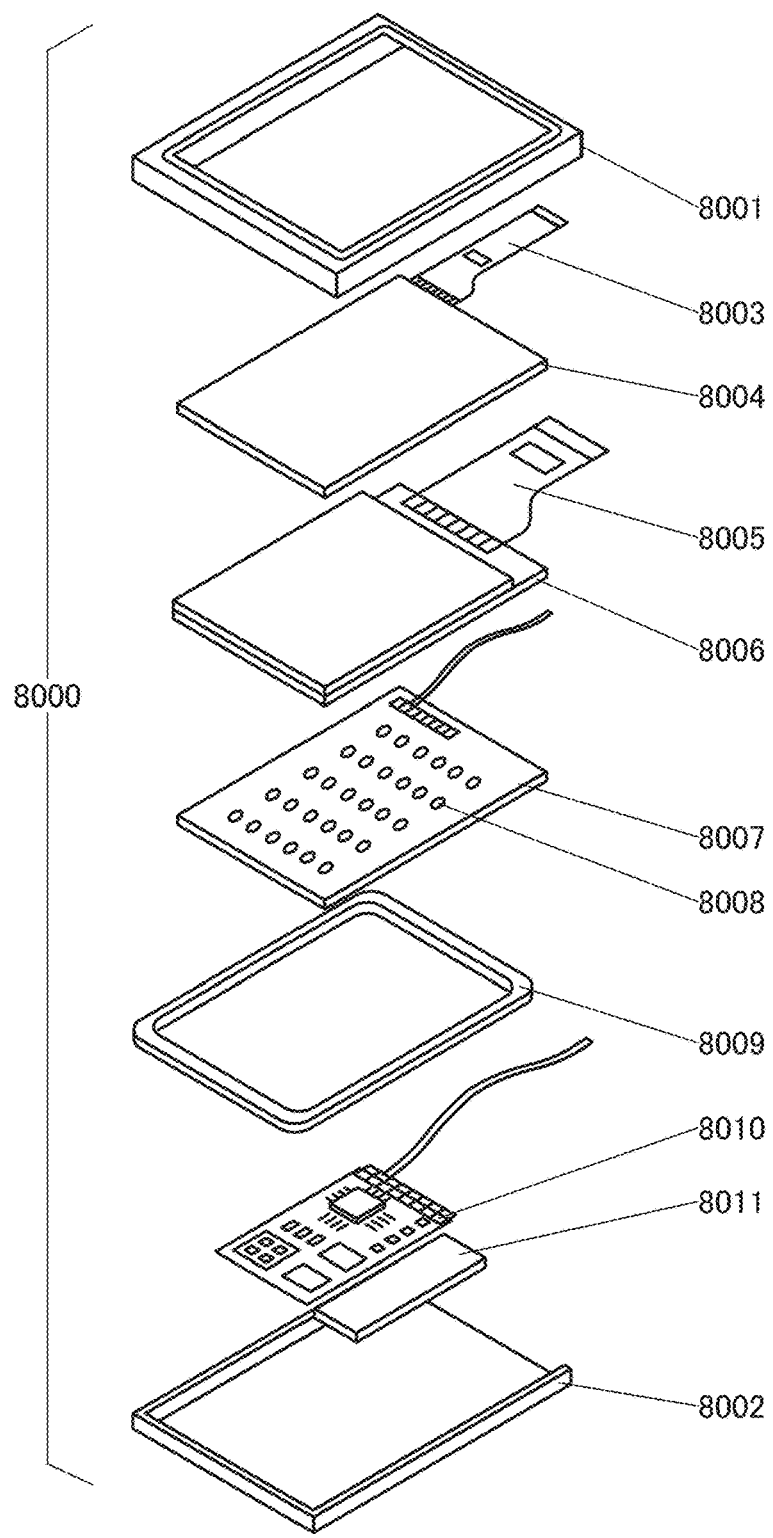
FIG. 22 illustrates a display module.

In a display module 8000 illustrated in FIG. 22, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed so as to overlap with the display panel 8006. A counter substrate (sealing substrate) of the display panel 8006 can have a touch panel function. A photosensor may be provided in each pixel of the display panel 8006 so that an optical touch panel is obtained.

The backlight 8007 includes light sources 8008. Note that although a structure in which the light sources 8008 are provided over the backlight 8007 is illustrated in FIG. 22, one embodiment of the present invention is not limited to this structure. For example, a structure in which the light sources 8008 are provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 23A to 23G illustrate electronic devices. These electronic devices can include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The electronic devices illustrated in FIGS. 23A to 23G can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that functions of the electronic devices illustrated in FIGS. 23A to 23G are not limited thereto, and the electronic devices can have a variety of functions. Although not illustrated in FIGS. 23A to 23G, the electronic devices may each have a plurality of display portions. The electronic devices may each have a camera or the like and a function of taking a still image, a function of taking a moving image, a function of storing the taken image in a storage medium (an external storage medium or a storage medium incorporated in the camera), a function of displaying the taken image on the display portion, and the like.

The electronic devices illustrated in FIGS. 23A to 23G will be described in detail below.

Figure 23A:
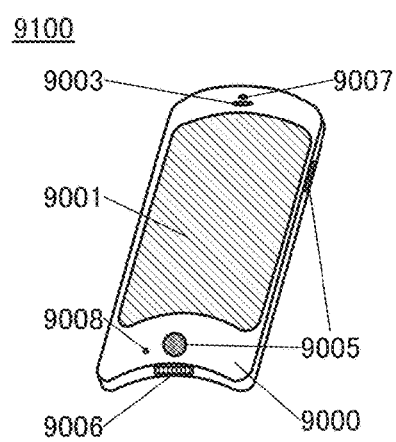
FIGS. 23A to 23G illustrate electronic devices.

FIG. 23A is a perspective view of a portable information terminal 9100. The display portion 9001 of the portable information terminal 9100 is flexible and thus can be incorporated along the curved surface of the housing 9000. Furthermore, the display portion 9001 includes a touch sensor, and operation can be performed by touching a screen with a finger, a stylus, or the like. For example, by touching an icon displayed on the display portion 9001, application can be started.

Figure 23D:
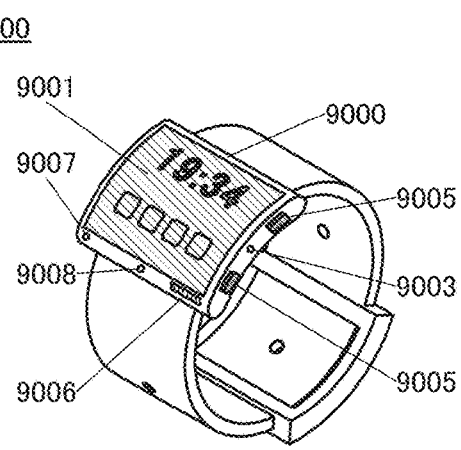
Figure 23B:
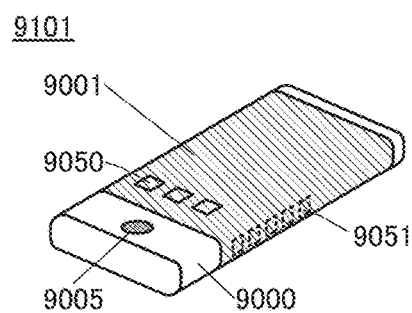

FIG. 23B is a perspective view of a portable information terminal 9101. The portable information terminal 9101 functions as, for example, one or more of a telephone set, a notebook, an information browsing system, and the like. Specifically, the portable information terminal 9101 can be used as a smartphone. Note that the speaker 9003, the connection terminal 9006, the sensor 9007, and the like, which are not illustrated in FIG. 23B, can be positioned in the portable information terminal 9101 as in the portable information terminal 9100 illustrated in FIG. 23A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include notification from a social networking service (SNS), display indicating reception of an e-mail or an incoming call, the title of the e-mail, the SNS, or the like, the sender of the e-mail, the SNS, or the like, the date, the time, remaining battery, and the reception strength of an antenna. Instead of the information 9051, the operation buttons 9050 or the like may be displayed in the position where the information 9051 is displayed.

Figure 23E:
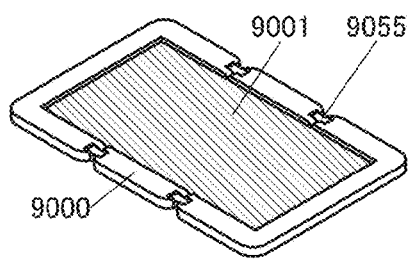
Figure 23C:
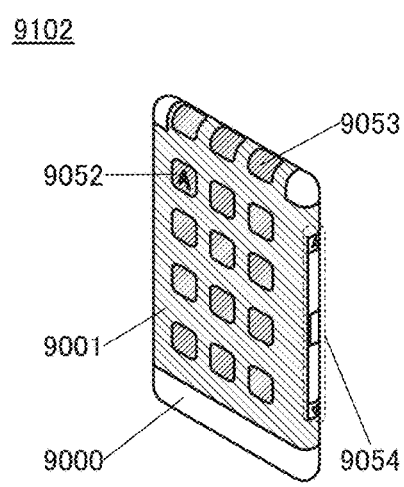

FIG. 23C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in the position that can be seen from above the portable information terminal 9102. Thus, the user can see the display without taking out the portable information terminal 9102 from the pocket and decide whether to answer the call.

FIG. 23D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is curved, and images can be displayed on the curved display surface. The portable information terminal 9200 can employ near field communication conformable to a communication standard. For example, hands-free calling can be achieved with mutual communication between the portable information terminal 9200 and a headset capable of wireless communication. Moreover, the portable information terminal 9200 includes the connection terminal 9006, and data can be directly transmitted to and received from another information terminal via a connector. Charging through the connection terminal 9006 is also possible. Note that the charging operation may be performed by wireless power feeding without using the connection terminal 9006.

Figure 23F:
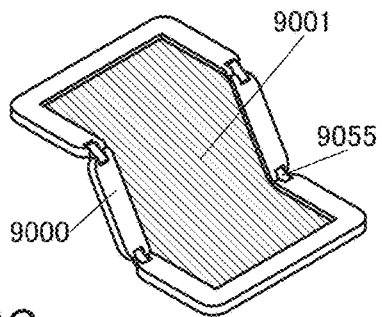
Figure 23G:
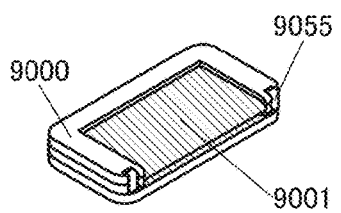

FIGS. 23E, 23F, and 23G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region provides high browsability. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from the opened state to the folded state. For example, the portable information terminal 9201 can be bent with a radius of curvature of greater than or equal to 1 mm and less than or equal to 150 mm.

The electronic devices described in this embodiment each include the display portion for displaying some sort of data. However, a semiconductor device of one embodiment of the present invention can also be used for an electronic device that does not include a display portion. Furthermore, the display portions of the electronic devices described in this embodiment may also be non-flexible and can display images on a flat surface without limitation to a flexible mode capable of displaying images on a curved display surface or a foldable mode.

The structures described in this embodiment can be used in appropriate combination with any of the structures described in the other embodiments.

(Embodiment 6)

In this embodiment, an example of a circuit configuration of a semiconductor device, which can hold stored data even when not powered, and which does not have a limitation on the number of write cycles, will be described with reference to FIG. 24.

<Circuit Configuration>

Figure 24:
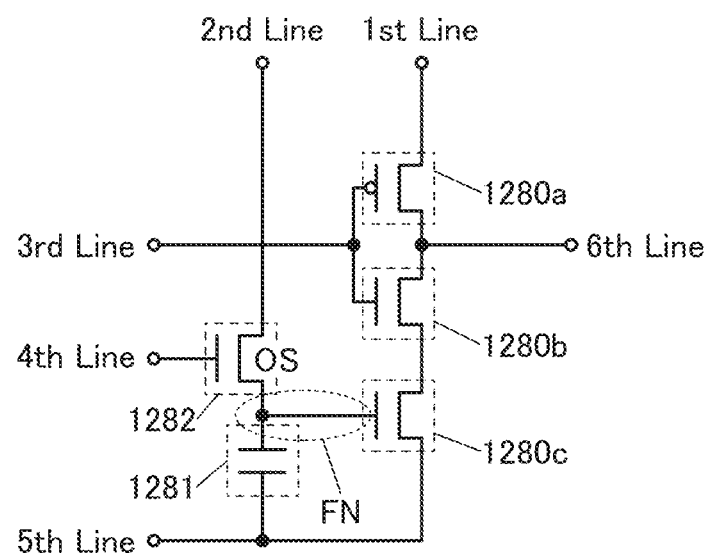
FIG. 24 illustrates a circuit configuration of a semiconductor device.

FIG. 24 shows an example of a circuit configuration of a semiconductor device. In FIG. 24, a first wiring (1st Line) is electrically connected to one of a source electrode and a drain electrode of a p-channel transistor 1280a. Further, the other of the source electrode and the drain electrode of the p-channel transistor 1280a is electrically connected to one of a source electrode and a drain electrode of an n-channel transistor 1280b. Further, the other of the source electrode and the drain electrode of the n-channel transistor 1280b is electrically connected to one of a source electrode and a drain electrode of an n-channel transistor 1280c.

A second wiring (2nd Line) is electrically connected to one of a source electrode and a drain electrode of a transistor 1282. Further, the other of the source electrode and the drain electrode of the transistor 1282, one electrode of a capacitor 1281, and a gate electrode of the n-channel transistor 1280c are electrically connected to each other.

A third wiring (3rd Line) and gate electrodes of the p-channel transistor 1280a and the n-channel transistor 1280b are electrically connected to each other. Further, a fourth wiring (4th Line) is electrically connected to a gate electrode of the transistor 1282. Further, a fifth wiring (5th Line), the other electrode of the capacitor 1281, and the other of the source electrode and the drain electrode of the n-channel transistor 1280c are electrically connected to each other. Further, a sixth wiring (6th Line), the other of the source electrode and the drain electrode of the p-channel transistor 1280a, and one of the source electrode and the drain electrode of the n-channel transistor 1280b are electrically connected to each other.

Note that the transistor 1282 can be formed using an oxide semiconductor (OS). Therefore, in FIG. 24, "OS" is written beside the transistor 1282. Note that the transistor 1282 may be formed using a material other than an oxide semiconductor. The transistor 100 or the transistor 170 described in Embodiment 1 can be used as the transistor 1282.

Further, in FIG. 24, a floating node (FN) is written at a connection portion of the other of the source electrode and the drain electrode of the transistor 1282, the one electrode of the capacitor 1281, and the gate electrode of the n-channel transistor 1280c. When the transistor 1282 is turned off, potentials supplied to the floating node, the one electrode of the capacitor 1281, and the gate electrode of the n-channel transistor 1280c can be held.

The circuit configuration in FIG. 24 utilizes the advantage that the potential of the gate electrode of the n-channel transistor 1280c can be held, whereby writing, holding, and reading of data can be performed as described below.

<Writing and Holding of Data>

First, writing and holding of data will be described. The potential of the fourth wiring is set to a potential at which the transistor 1282 is turned on, so that the transistor 1282 is turned on. Accordingly, the potential of the second wiring is supplied to the gate electrode of the n-channel transistor 1280c and the capacitor 1281. That is, predetermined charge is supplied to the gate electrode of the n-channel transistor 1280c (writing). After that, the potential of the fourth wiring is set to a potential at which the transistor 1282 is turned off, and the transistor 1282 is turned off. Accordingly, charge applied to the gate electrode of the n-channel transistor 1280c is held (holding).

Since the off-state current of the transistor 1282 is significantly small, the charge in the gate electrode of the n-channel transistor 1280c is held for a long time.

<Reading of Data>

Next, reading of data will be described. When the potential of the third wiring is a Low-level potential, the p-channel transistor 1280a is turned on and the n-channel transistor 1280b is turned off. At this time, the potential of the first wiring is applied to the sixth wiring. On the other hand, when the potential of the third wiring is a High-level potential, the p-channel transistor 1280a is turned off and the n-channel transistor 1280b is turned on. At this time, the potential of the sixth wiring varies in response to the amount of charge held in the floating node (FN). Therefore, the retained data can be read by measuring the potential of the sixth wiring (reading).

The transistor 1282 in which a channel formation region is formed using an oxide semiconductor has a significantly low off-state current. The off-state current of the transistor 1282 using an oxide semiconductor is lower than or equal to one hundred-thousandth of that of the off-state current of a transistor formed using a silicon semiconductor or the like; thus, loss of the electrical charge accumulated in the floating node (FN) due to leakage current of the transistor 1282 is as small as negligible. That is, the transistor 1282 formed using an oxide semiconductor makes it possible to obtain a non-volatile memory circuit which can hold data even without being supplied with power.

By applying the semiconductor device including the above-described circuit configuration to a memory device such as a register or a cache memory, data in the memory device can be prevented from being erased owing to the stop of the supply of the power supply voltage. Furthermore, shortly after the supply of the power supply voltage is restarted, the memory device can be returned to the same state as that before the power supply is stopped. Therefore, the power supply can be stopped even for a short time when the whole memory device or one or a plurality of logic circuits included in the memory device is in a standby state, resulting in lower power consumption.

The structures, methods, and the like described in this embodiment can be used in appropriate combination with any of the structures, methods, and the like described in the other embodiments.

EXAMPLE

In this example, transistors corresponding to the transistor 170 illustrated in FIGS. 6A and 6B were fabricated, and their $I_d$-$V_g$ characteristics were evaluated.

Samples A1 to A3 described below were formed and used for the evaluation in this example. Note that Samples A1 to A3 are each a sample of one embodiment of the present invention. A transistor of Sample A1 has a channel length L of 6 μm and a channel width W of 5 μm; a transistor of Sample A2 has a channel length L of 6 μm and a channel width W of 50 μm; and a transistor of Sample A3 has a channel length L of 6 μm and a channel width W of 200 μm. As Samples A1 to A3, 10 transistors each having the above corresponding size were formed.

Samples A1 to A3 formed in this example will be described below. Samples A1 to A3 were formed through the same process, and are different from each other in the channel width W of the transistor. Note that the reference numerals used for the transistor 170 in FIGS. 6A and 6B are used in the following description.

<Fabrication Method of Samples A1 to A3>

First, the conductive film 104 was formed over the substrate 102. As the substrate 102, a glass substrate was used. Note that the size and the thickness of the glass substrate were 600 mm×720 mm and 0.7 mm, respectively. As the conductive film 104, a 100-nm-thick tungsten film was formed with a sputtering apparatus.

Next, the insulating films 106 and 107 were formed over the substrate 102 and the conductive film 104. As the insulating film 106, a 400-nm-thick silicon nitride film was formed with a PECVD apparatus. As the insulating film 107, a 50-nm-thick silicon oxynitride film was formed with a PECVD apparatus.

The insulating film 106 was formed as follows. First, a 50-nm-thick silicon nitride film was formed under the conditions where the substrate temperature was 350° C.; a silane gas at a flow rate of 200 sccm, a nitrogen gas at a flow rate of 2000 sccm, and an ammonia gas at a flow rate of 100 sccm were introduced into a chamber; the pressure was set to 100 Pa; and an RF power of 2000 W was supplied between parallel-plate electrodes placed in a PECVD apparatus. Then, the flow rate of an ammonia gas was changed to 2000 sccm to form a 300-nm-thick silicon nitride film. Finally, the flow rate of an ammonia gas was changed to 100 sccm to form a 50-nm-thick silicon nitride film.

The insulating film 107 was formed under the conditions where the substrate temperature was 350° C., a silane gas at a flow rate of 20 sccm and a dinitrogen monoxide gas at a flow rate of 3000 sccm were introduced into a chamber, the pressure was 40 Pa, and an RF power of 100 W was supplied between parallel-plate electrodes provided in a PECVD apparatus.

Then, the oxide semiconductor film 108 was formed over the insulating film 107. The oxide semiconductor film 108 has a layered structure of the first oxide semiconductor film 108a on the conductive film 104 (functioning as a gate electrode) side and the second oxide semiconductor film 108b over the first oxide semiconductor film 108a. As the first oxide semiconductor film 108a, a 10-nm-thick IGZO film was formed; as the second oxide semiconductor film 108b, a 15-nm-thick IGZO film was formed.

Note that the first oxide semiconductor film 108a was formed under the conditions where the substrate temperature was 170° C., an argon gas at a flow rate of 140 sccm and an oxygen gas at a flow rate of 60 sccm were introduced into a chamber, the pressure was 0.6 Pa, and an AC power of 2500 W was applied to a polycrystalline metal oxide sputtering target (having an atomic ratio of In:Ga:Zn=4:2:4.1).

Note that the second oxide semiconductor film 108b was formed under the conditions where the substrate temperature was 170° C., an argon gas at a flow rate of 100 sccm and an oxygen gas at a flow rate of 100 sccm were introduced into a chamber, the pressure was 0.6 Pa, and an AC power of 2500 W was applied to a polycrystalline metal oxide sputtering target (having an atomic ratio of In:Ga:Zn=1:1:1.2).

Next, the conductive films 112a and 112b were formed over the insulating film 107 and the oxide semiconductor film 108. The conductive films 112a and 112b were formed in such a manner that a 50-nm-thick tungsten film, a 400-nm-thick aluminum film, and a 100-nm-thick titanium film were successively formed in this order in a vacuum with a sputtering apparatus.

After that, the insulating film 114 and the insulating film 116 were formed over the insulating film 107, the oxide semiconductor film 108, and the conductive films 112a and 112b. As the insulating film 114, a 50-nm-thick silicon oxynitride film was formed with a PECVD apparatus. As the insulating film 116, a 400-nm-thick silicon oxynitride film was formed with a PECVD apparatus. Note that the insulating film 114 and the insulating film 116 were formed successively in a vacuum with a PECVD apparatus.

The insulating film 114 was formed under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in a PECVD apparatus. The insulating film 116 was formed under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus.

Then, first heat treatment was performed. The first heat treatment was performed at 350° C. for 1 hour in a nitrogen gas atmosphere.

A 5-nm-thick ITSO film was formed over the insulating film 116 with a sputtering apparatus. The ITSO film was formed under the conditions where the substrate temperature was room temperature, an argon gas at a flow rate of 72 sccm and an oxygen gas at a flow rate of 5 sccm were introduced into a chamber, the pressure was 0.15 Pa, and a DC power of 1000 W was supplied to a metal oxide target ($In_2O_3$:$SnO_2$:$SiO_2$=85:10:5 [wt. %]) provided in a sputtering apparatus.

Next, oxygen addition treatment was performed on the insulating film 116 through the ITSO film. The oxygen addition treatment was performed with an ashing apparatus under the conditions where the substrate temperature was 40° C., an oxygen gas at a flow rate of 250 sccm was introduced into a chamber, the pressure was 15 Pa, and an RF power of 4500 W was supplied for 120 seconds between parallel-plate electrodes provided in the ashing apparatus so that a bias would be applied to the substrate side.

Then, the ITSO film was removed to expose the insulating film 116. The ITSO film was removed using a wet etching apparatus in such a manner that etching was performed using an oxalic acid solution at a concentration of 5% for 300 seconds and then etching was performed using hydrofluoric acid at a concentration of 0.5% for 15 seconds.

Next, the insulating film 118 was formed over the insulating film 116. As the insulating film 118, a 100-nm-thick silicon nitride film was formed with a PECVD apparatus. Note that the substrate temperature in the PECVD apparatus in the formation of the insulating film 118 was 350° C.

Next, the opening 142c reaching the conductive film 112b and the openings 142a and 142b reaching the conductive film 104 were formed. The openings 142a, 142b, and 142c were formed with a dry etching apparatus.

Next, a conductive film was formed over the insulating film 118 to cover the openings 142a, 142b, and 142c and processed to form the conductive films 120a and 120b. As the conductive films 120a and 120b, a 100-nm-thick ITSO film was formed with a sputtering apparatus. The composition of a target used for forming the ITSO film was the same as that used for forming the ITSO film described above.

Then, second heat treatment was performed. The second heat treatment was performed at 250° C. for 1 hour in a nitrogen gas atmosphere.

Through the above process, Samples A1 to A3 of this example were fabricated. Note that the highest temperature in the process for fabricating Samples A1 to A3 was 350° C.

<$I_d$-$V_g$ Characteristics of Transistors>

Figure 25A:
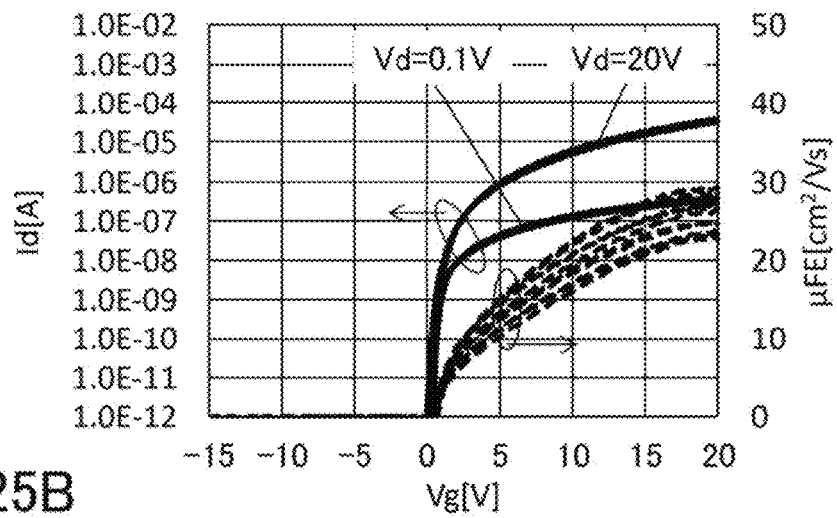
FIGS. 25A to 25C show $I_d$-$V_g$ characteristics of transistors in Example.
Figure 25B:
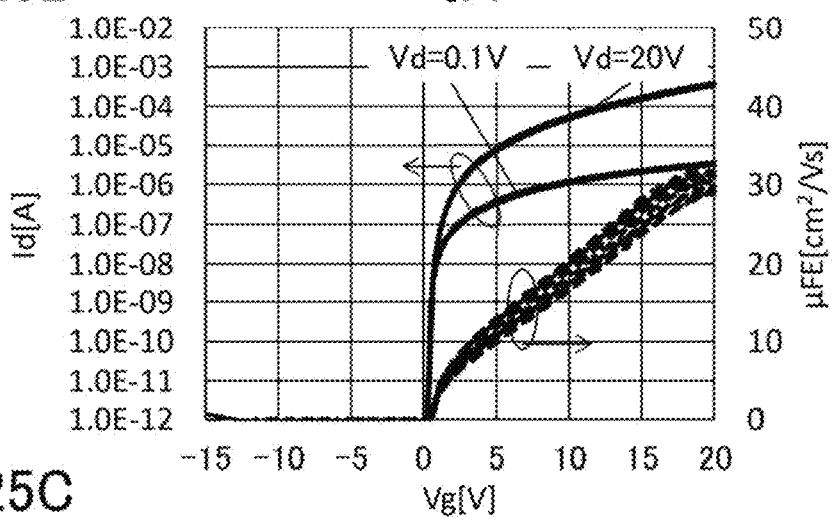
Figure 25C:
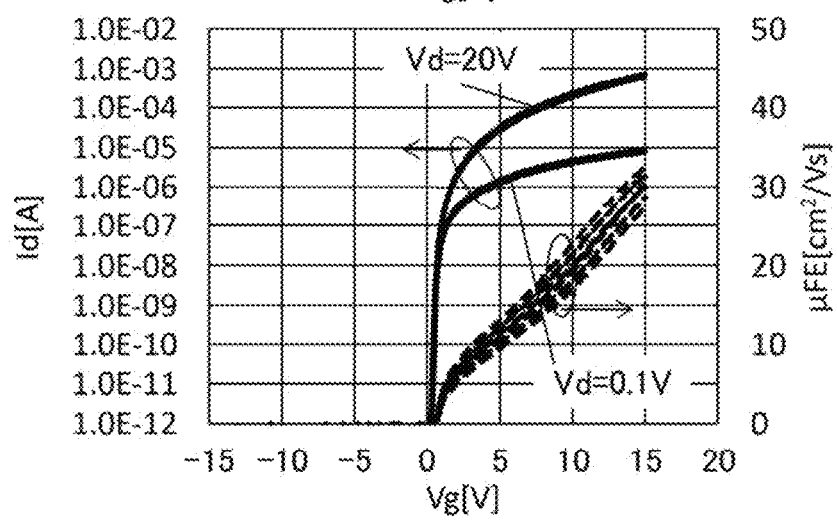

Next, $I_d$-$V_g$ characteristics of Samples A1 to A3 fabricated in the above manner were measured. FIGS. 25A to 25C show the $I_d$-$V_g$ characteristics of Samples A1 to A3. Note that FIG. 25A shows the $I_d$-$V_g$ characteristics of Sample A1, FIG. 25B shows the $I_d$-$V_g$ characteristics of Sample A2, and FIG. 25C shows the $I_d$-$V_g$ characteristics of Sample A3. In each of FIGS. 25A to 25C, the first vertical axis represents $I_d$ (A), the second vertical axis represents μFE (cm$^2$/Vs), and the horizontal axis represents $V_g$ (V). Note that the characteristics of 10 transistors are overlaid in each of FIGS. 25A to 25C.

In measuring the $I_d$-$V_g$ characteristics of the transistor 170, a voltage applied to the conductive film 104 (hereinafter the voltage is also referred to as gate voltage ($V_g$)) that functions as a first gate electrode and a voltage ($V_{bg}$) applied to the conductive film 120b that functions as a second gate electrode were each changed from −15 V to +20 V in increments of 0.25 V. Note that only in the case of the transistors of Sample A3, $V_g$ and $V_{bg}$ were each changed from −15 V to +15 V in increments of 0.25 V. A voltage applied to the conductive film 112a (hereinafter the voltage is also referred to as source voltage (Vs)) that functions as a source electrode was 0 V (comm), and a voltage applied to the conductive film 112b (hereinafter the voltage is also referred to as drain voltage ($V_d$)) that functions as a drain electrode was 0.1 V or 20 V. As for the field-effect mobility (μFE), the results obtained at $V_d$=20 V are shown.

The results of FIGS. 25A to 25C reveal that the FET characteristics hardly depend on the channel width W even in the case where the highest temperature in the process is as relatively low as 350° C., and the FETs achieve normally-off characteristics stably. Note that in this example, the normally-off characteristics of the transistor mean that a current per micrometer of a channel width flowing between a drain and a source at $V_g$=0 V is 1×10$^{-20}$ A or less at room temperature, 1×10$^{-18}$ A or less at 85° C., or 1×10$^{-16}$ A or less at 125° C. The transistors of Samples A1 to A3 of one embodiment of the present invention exhibited high field-effect mobility. In particular, the transistors of Samples A2 and A3 exhibited high field-effect mobility, higher than 30 cm$^2$/Vs.

As described above, in the semiconductor device of one embodiment of the present invention, the oxide semiconductor film has a layered structure, which enables the semiconductor device to have excellent electrical characteristics (specifically, high reliability and high field-effect mobility) even in the case where the process temperature is relatively low (for example, 350° C.).

The structures described in this embodiment can be used in appropriate combination with any of the structures described in the other embodiments.

REFERENCE NUMERALS

100: transistor, 102: substrate, 104: conductive film, 106: insulating film, 107: insulating film, 108: oxide semiconductor film, 108a: oxide semiconductor film, 108b: oxide semiconductor film, 109: oxide semiconductor film, 109a: oxide semiconductor film, 109b: oxide semiconductor film, 112: conductive film, 112a: conductive film, 112b: conductive film, 114: insulating film, 116: insulating film, 118: insulating film, 120: conductive film, 120a: conductive film, 120b: conductive film, 131: barrier film, 136a: mask, 136b: mask, 138: etching agent, 139: etching agent, 140: oxygen, 140a: oxygen, 141: arrow, 142: etching agent, 142a: opening, 142b: opening, 142c: opening, 170: transistor, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal element, 572: light-emitting element, 700: display device, 701: substrate, 702: pixel portion, 704: source driver circuit portion, 705: substrate, 706: gate driver circuit portion, 708: FPC terminal portion, 710: signal line, 711: wiring portion, 712: sealant, 716: FPC, 730: insulating film, 732: sealing film, 734: insulating film, 736: coloring film, 738: light-blocking film, 750: transistor, 752: transistor, 760: connection electrode, 764: insulating film, 766: insulating film, 767: oxide semiconductor film, 768: insulating film, 770: planarization insulating film, 772: conductive film, 774: conductive film, 775: liquid crystal element, 776: liquid crystal layer, 778: structure, 780: anisotropic conductive film, 782: light-emitting element, 784: conductive film, 786: EL layer, 788: conductive film, 790: capacitor, 1280a: p-channel transistor, 1280b: n-channel transistor, 1280c: n-channel transistor, 1281: capacitor, 1282: transistor, 5100: pellet, 5100a: pellet, 5100b: pellet, 5101: ion, 5102: zinc oxide layer, 5103: particle, 5105a: pellet, 5105a1: region, 5105a2: pellet, 5105b: pellet, 5105c: pellet, 5105d: pellet, 5105d1: region, 5105e: pellet, 5120: substrate, 5130: target, 5161: region, 8000: display module, 8001: upper cover, 8002: lower cover, 8003: FPC, 8004: touch panel, 8005: FPC, 8006: display panel, 8007: backlight, 8008: light source, 8009: frame, 8010: printed board, 8011: battery, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: portable information terminal, 9101: portable information terminal, 9102: portable information terminal, 9200: portable information terminal, and 9201: portable information terminal.

This application is based on Japanese Patent Application serial no. 2015-019938 filed with Japan Patent Office on Feb. 4, 2015, the entire contents of which are hereby incorporated by reference.

The invention claimed is:

1. A method for manufacturing a semiconductor device comprising:
   forming an oxide semiconductor film at a first temperature;
   processing the oxide semiconductor film into an island shape;
   depositing a material to be a source electrode and a drain electrode over the oxide semiconductor film by a sputtering method;
   processing the material to form the source electrode and the drain electrode;
   forming a protective insulating film over the oxide semiconductor film, the source electrode and the drain electrode;
   heating the protective insulating film at a second temperature which is higher than the first temperature;
   forming a metal oxide film over the protective insulating film by a sputtering method; and
   heating the protective insulating film at a third temperature which is higher than the first temperature,
   wherein at least one of the second temperature and the third temperature is the highest in the method.

2. The method for manufacturing the semiconductor device, according to claim 1,
   wherein the metal oxide film is an aluminum oxide film, a hafnium oxide film, or an yttrium oxide film.

3. The method for manufacturing the semiconductor device, according to claim 1,
wherein the oxide semiconductor film has a layered structure of a first oxide semiconductor film having an atomic ratio of In:M:Zn =4:α1(1.5≤α1≤2.5):α2 (2.5≤α2≤3.5) and a second oxide semiconductor film having an atomic ratio of In:M:Zn =1:β1 (0.8≤β1≤1.2): α2 (0.8≤β2≤1.2), and
wherein M is aluminum, gallium, yttrium, or tin.

4. The method for manufacturing the semiconductor device, according to claim 1,
wherein the oxide semiconductor film includes a crystal part, and
wherein the crystal part has c-axis alignment.

5. The method for manufacturing the semiconductor device, according to claim 1,
wherein the first temperature is lower than 340° C.

6. The method for manufacturing the semiconductor device, according to claim 1,
wherein the first temperature is higher than or equal to 100° C. and lower than or equal to 200° C.

7. The method for manufacturing the semiconductor device, according to claim 1,
wherein at least one of the second temperature and the third temperature is lower than 375° C.

8. The method for manufacturing the semiconductor device, according to claim 1,
wherein at least one of the second temperature and the third temperature is higher than or equal to 340° C. and lower than or equal to 360° C.

9. The method for manufacturing the semiconductor device, according to claim 1,
wherein the protective insulating film has a layered structure comprising a first protective insulating film and a second protective insulating film over the first protective insulating film.

10. The method for manufacturing a semiconductor device according to claim 1,
wherein excess oxygen or an oxygen radical is added to the protective insulating film when the metal oxide film is formed, and
wherein the excess oxygen or the oxygen radical diffuses into the oxide semiconductor film when heating of the protective insulating film at the third temperature is conducted.

11. A method for manufacturing a semiconductor device, comprising:
forming an oxide semiconductor film at a first temperature;
processing the oxide semiconductor film into an island shape;
depositing a material to be a source electrode and a drain electrode over the oxide semiconductor film by a sputtering method;
processing the material to form the source electrode and the drain electrode;
forming a protective insulating film over the oxide semiconductor film, the source electrode, and the drain electrode;
heating the protective insulating film at a second temperature which is higher than the first temperature; and
forming a metal oxide film at a third temperature which is higher than the first temperature over the protective insulating film by a sputtering method,
wherein at least one of the second temperature and the third temperature is the highest in the method.

12. The method for manufacturing the semiconductor device, according to claim 11,
wherein the metal oxide film is an aluminum oxide film, a hafnium oxide film, or an yttrium oxide film.

13. The method for manufacturing the semiconductor device, according to claim 11,
wherein the oxide semiconductor film has a layered structure of a first oxide semiconductor film having an atomic ratio of In:M:Zn =4:α1 (1.5≤α1≤2.5):α2 (2.5≤α2≤3.5) and a second oxide semiconductor film having an atomic ratio of In:M:Zn =1:β1 (0.8≤β1≤1.2): β2 (0.8≤β2≤1.2), and
wherein M is aluminum, gallium, yttrium, or tin.

14. The method for manufacturing the semiconductor device, according to claim 11,
wherein the oxide semiconductor film includes a crystal part, and
wherein the crystal part has c-axis alignment.

15. The method for manufacturing the semiconductor device, according to claim 11,
wherein the first temperature is lower than 340° C.

16. The method for manufacturing the semiconductor device, according to claim 11,
wherein the first temperature is higher than or equal to 100° C. and lower than or equal to 200° C.

17. The method for manufacturing the semiconductor device, according to claim 11,
wherein at least one of the second temperature and the third temperature is lower than 375° C.

18. The method for manufacturing the semiconductor device, according to claim 11,
wherein at least one of the second temperature and the third temperature is higher than or equal to 340° C. and lower than or equal to 360° C.

19. The method for manufacturing the semiconductor device, according to claim 11,
wherein the protective insulating film has a layered structure comprising a first protective insulating film and a second protective insulating film over the first protective insulating film.

20. The method for manufacturing the semiconductor device, according to claim 11,
wherein excess oxygen or an oxygen radical is added to the protective insulating film when the metal oxide film is formed, and
wherein oxygen, the excess oxygen, or the oxygen radical in the protective insulating film diffuses into the oxide semiconductor film when the metal oxide film is formed.

* * * * *